(12) United States Patent
Kim et al.

(10) Patent No.: US 7,451,360 B2
(45) Date of Patent: *Nov. 11, 2008

(54) METHOD FOR MONITORING AN INTERNAL CONTROL SIGNAL OF A MEMORY DEVICE AND APPARATUS THEREFOR

(75) Inventors: Ji Hyun Kim, Seoul (KR); Young Jun Nam, Kwangju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 582 days.

This patent is subject to a terminal disclaimer.

(21) Appl. No.: 10/999,340

(22) Filed: Nov. 30, 2004

(65) Prior Publication Data

US 2005/0257121 A1 Nov. 17, 2005

(30) Foreign Application Priority Data

May 17, 2004 (KR) ...................... 10-2004-0034896

(51) Int. Cl.
*G11C 29/00* (2006.01)

(52) U.S. Cl. ...................................... 714/700; 365/194
(58) Field of Classification Search ................ 714/707, 714/700; 365/194
See application file for complete search history.

(56) References Cited

U.S. PATENT DOCUMENTS

| | | | | |
|---|---|---|---|---|
| 4,174,539 A * | 11/1979 | Timm | ............................. | 365/8 |
| 5,386,517 A * | 1/1995 | Sheth et al. | .................... | 710/60 |
| 5,519,883 A * | 5/1996 | White et al. | ................ | 710/315 |
| 5,844,858 A * | 12/1998 | Kyung | ........................ | 365/233 |
| 6,433,607 B2 * | 8/2002 | Kawasaki et al. | ........... | 327/299 |
| 6,484,268 B2 * | 11/2002 | Tamura et al. | .............. | 713/600 |
| 6,909,653 B2 * | 6/2005 | Shimadu et al. | ............. | 365/203 |
| 6,934,049 B1 * | 8/2005 | Yamada | ..................... | 358/1.16 |

* cited by examiner

*Primary Examiner*—M. Mujtaba K Chaudry
(74) *Attorney, Agent, or Firm*—Ladas & Parry LLP

(57) ABSTRACT

Disclosed is a method for monitoring an internal control signal of a memory device and an apparatus therefore. The method includes (a) generating a first signal having a first pulse width by a burst operation command, (b) receiving the first signal, and generating N−1 (where, N is a burst length) second signals having a second pulse width, (c) receiving the first signal and the second signals, and outputting a third signal by changing the first pulse width of the first signal and the second pulse width of the second signals in accordance with a variation of a frequency of a clock signal of the memory device, (d) outputting the third signal to an external pin of the memory device and monitoring the third signal, and (e) adjusting a pulse width of a signal that controls an operation of a data bus connecting a bit-line sense amplifier and a data sense amplifier using the third signal.

14 Claims, 24 Drawing Sheets

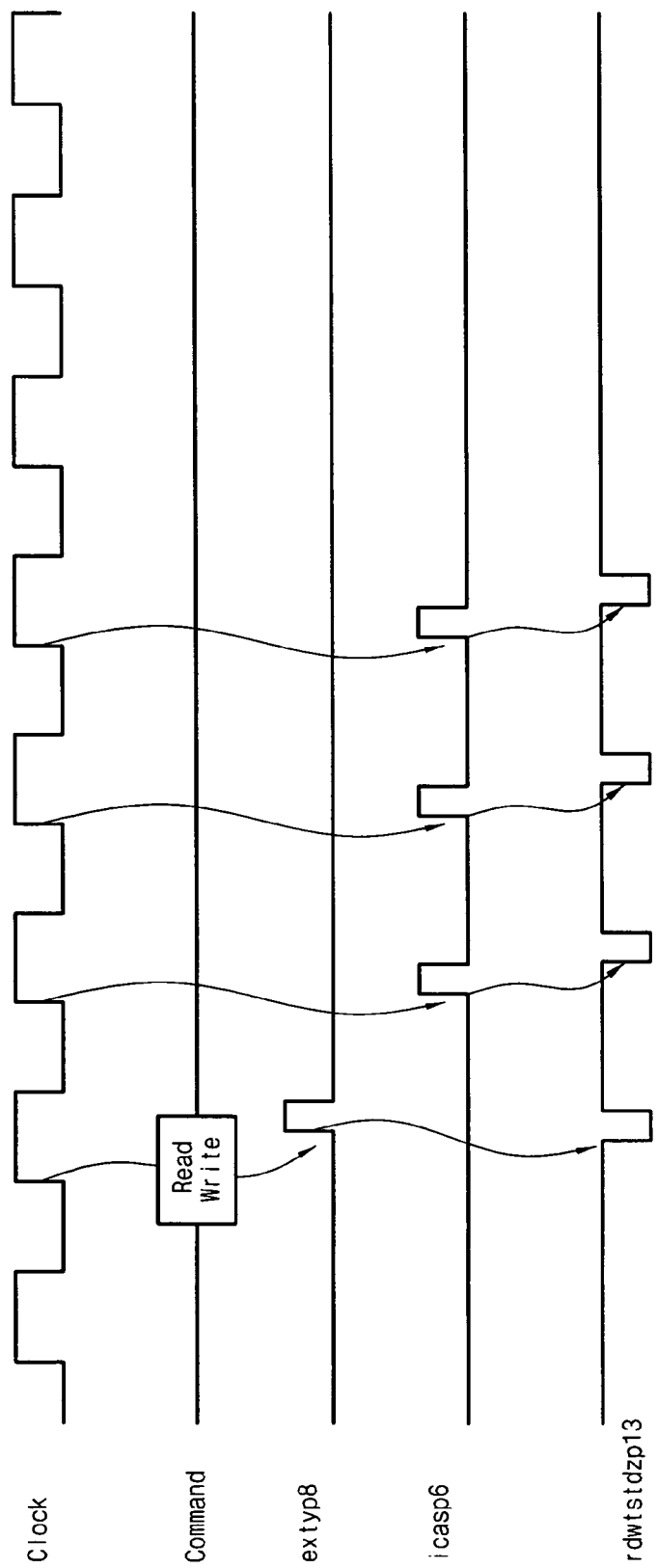

METHOD FOR MONITORING AN INTERNAL CONTROL SIGNAL OF A MEMORY DEVICE AND APPARATUS THEREFOR

BACKGROUND OF THE INVENTION

1. Field of the Invention

The present invention relates to a method for monitoring an internal signal for controlling the operation of a sense amplifier of a memory device and an apparatus therefor, and more particularly to a method for monitoring an internal signal for controlling the operation of a sense amplifier of a memory device and an apparatus therefor that can control the operation section of the sense amplifier in accordance with a variation of the operating frequency of the memory device.

2. Description of the Prior Art

FIG. 1 is a view explaining read/write operations of a general memory device.

As illustrated in FIG. 1, in a write operation, data applied through an input/output (I/O) data pad is transferred to a bit-line sense amplifier through a data input buffer, a data input register, and a data driver. In a read operation, cell data amplified by the bit-line sense amplifier is transferred to the I/O data pad through a data sense amplifier, a pipe register, and a data output buffer.

In FIG. 1, a Signal Yi is a pulse signal for controlling column lines, which controls the operation of a data bus connecting the bit-line sense amplifier and the data sense amplifier. While the Signal Yi for controlling the data bus is enabled, write data is transferred from a write driver to the bit-line sense amplifier, and read data is transferred from the bit-line sense amplifier to the data sense amplifier.

Accordingly, in order to transfer valid data in an active operation (i.e., in a read or write operation), it is favorable to widen the pulse width of the Signal Yi. The wide pulse width of the Signal Yi heightens the data restore under the condition of the same tDPL (which is a time period from the time point that a CAS (Column Address Strobe) pulse signal is internally generated by a write command to the time point that a pre-charge pulse signal is internally generated by a pre-charge command).

Accordingly, it is general to first set the pulse width of the Signal Yi as wide as possible within a permitted limit and then to reduce the pulse width as needed. For reference, as the operating frequency of the memory device is increased (i.e., as the clock period is reduced), the permitted pulse width of the Signal Yi becomes reduced.

Meanwhile, the Signal Yi as described above is made by receiving a read/write strobe pulse signal rdwtstbzpl3 output from a read/write strobe pulse generating circuit, and thus the read/write strobe pulse generating circuit will be explained hereinafter.

FIG. 2a is a circuit diagram of a conventional read/write strobe pulse generating circuit, and FIG. 2b is a waveform diagram of signals appearing in the circuit of FIG. 2a.

Referring to FIG. 2a, a pulse signal extyp8 and a pulse signal icasp6 are signals for making data transmission lines of a memory cell array and data transmission lines of a peripheral circuit short or open in order to read and provide data stored in the cell array (i.e., core region) of the memory device to the peripheral circuit or to write data applied to the peripheral circuit in the memory cell array. For convenience in explanation, the region that includes the memory cell and the bit-line sense amplifier is called a core region, and the remaining region is called a peripheral circuit.

More specifically, the extyp8 signal is a pulse signal generated in synchronization with a clock signal if a read or write command (i.e., burst command) is applied from an outside. The icasp6 signal is a signal used to operate the memory device by creating a self burst operation command as long as a burst length determined by an MRS (Mode Register Set) from a clock that is one-period later than a clock at which the read or write command is applied from the outside.

The read/write strobe pulse signal rdwtstbzpl3 is a signal that is activated in synchronization with burst operation commands (External=extyp8 & Internal=icasp61) whenever these signals are activated and as long as the burst length determined by the general MRS. That is, the rdwtstbzp13 signal is a signal that reports the time point of activation of an input/output sense amplifier used to sufficiently amplify data transmitted from the core region to the peripheral circuit and to transmit the amplified data to a data output buffer. After the data is amplified and transmitted, the rdwtstbzp13 signal is used to reset the data transmission lines of the peripheral circuit.

A pwrup signal is a signal for setting an initial value, which is first in a high level, goes to a low level, and then is kept in the low level. A term_z signal is a signal used in a test mode, and is kept in a low level during its normal operation. A tm_clkpulsez signal is a signal used in a test mode. The signals as described above will be explained in more detail later.

The operation of the circuit illustrated in FIG. 2a will now be explained with reference to a waveform diagram of FIG. 2b.

As can be seen in FIG. 2b, if a read/write command is applied in synchronization with a clock signal, a pulse signal extyp8 is generated. If the extyp8 signal is generated, plural pulses icasp6 are sequentially generated in synchronization with the next clock. As illustrated in FIG. 2b, the read/write strobe pulse signal rdwtstbzp13 is generated in synchronization with a rising edge of the pulse signals extyp8 and icasp6.

It can be seen from the conventional circuit of FIG. 2a that a pulse width adjustment unit 200 for determining the pulse width of the read/write strobe pulse signal rdwtstbzpl3 is fixed irrespective of the operating frequency of the memory device. That is, because a delay time obtained through a delay unit 20 of the pulse width adjustment unit 200 is fixed, the pulse width of the signal output from the pulse width adjustment unit 200 is just constant.

If the operating frequency of the memory device is varied, however, it becomes necessary to adjust the pulse width of the read/write strobe pulse signal rdwtstbzpl3.

Conventionally, if the operating frequency of the memory device is varied, the delay time of the delay unit 20 is adjusted by correcting a metal option during a FIB work. However, this requires plenty of cost and time.

The conventional circuit also has the problems in that it is not easy to monitor the internal voltage of the memory device after a packaging process of the memory device.

SUMMARY OF THE INVENTION

Accordingly, the present invention has been made to solve the above-mentioned problems occurring in the prior art, and an object of the present invention is to provide a method capable of automatically adjusting the pulse width of a signal output from a pulse width adjustment unit in accordance with a variation of the operating frequency of a memory device.

Another object of the present invention is to provide a method capable of adjusting the pulse width of a read/write strobe pulse signal rdwtstbzpl3 in correspondence to a change of an external clock signal.

Still another object of the present invention is to provide a method for adjusting a delay time of a delay unit in a pulse width adjustment unit using a CL (CAS Latency) that changes according to the operating frequency of a memory device.

Still another object of the present invention is to provide a method capable of monitoring the pulse width of a read/write strobe pulse signal in a packaged state of a memory device.

In order to accomplish these objects, there is provided a method for monitoring an internal control signal of a memory device, comprising the steps of (a) generating a first signal having a first pulse width by a burst operation command, (b) receiving the first signal, and generating N−1 (where, N is a burst length) second signals having a second pulse width, (c) receiving the first signal and the second signals, and outputting a third signal by changing the first pulse width of the first signal and the second pulse width of the second signals in accordance with a variation of a frequency of a clock signal of the memory device, (d) outputting the third signal to an external pin of the memory device and monitoring the third signal, and (e) adjusting a pulse width of a signal that controls an operation of a data bus connecting a bit-line sense amplifier and a data sense amplifier using the third signal.

In another aspect of the present invention, there is provided a method for monitoring an internal control signal of a memory device, comprising the steps of (a) generating a first signal having a first pulse width by a burst operation command, (b) receiving the first signal, and generating N−1 (where, N is a burst length) second signals having a second pulse width, (c) receiving the first signal and the second signals, and outputting a third signal by changing the first pulse width of the first signal and the second pulse width of the second signals in accordance with a CAS (Column Address Strobe) latency of the memory device, (d) outputting the third signal to an external pin of the memory device and monitoring the third signal, and (e) adjusting a pulse width of a signal that controls an operation of a data bus connecting a bit-line sense amplifier and a data sense amplifier using the third signal.

BRIEF DESCRIPTION OF THE DRAWINGS

The above and other objects, features and advantages of the present invention will be more apparent from the following detailed description taken in conjunction with the accompanying drawings, in which:

FIG. 2b is a waveform diagram of signals appearing in the circuit of FIG. 2a;

FIG. 9 is a waveform diagram explaining the operation of the conventional circuit illustrated in FIG. 2a;

FIG. 19 is a waveform diagram of output signals of the conventional circuit illustrated in FIG. 2a;

DETAILED DESCRIPTION OF THE PREFERRED EMBODIMENTS

Figure 1:
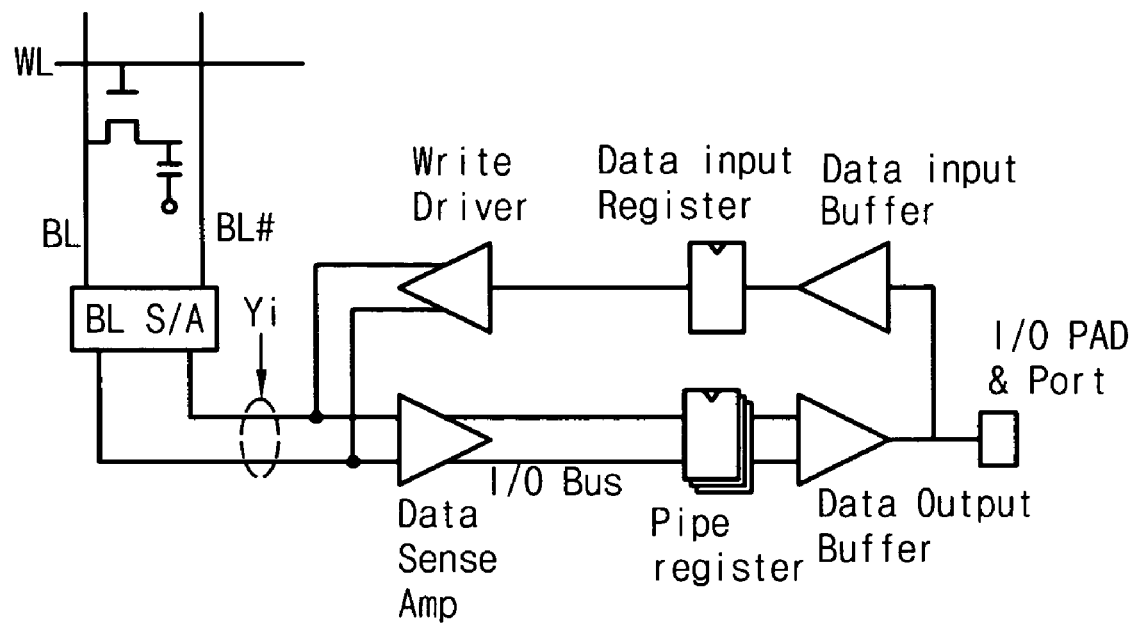
FIG. 1 is a view explaining read/write operations of a conventional memory device.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 3:
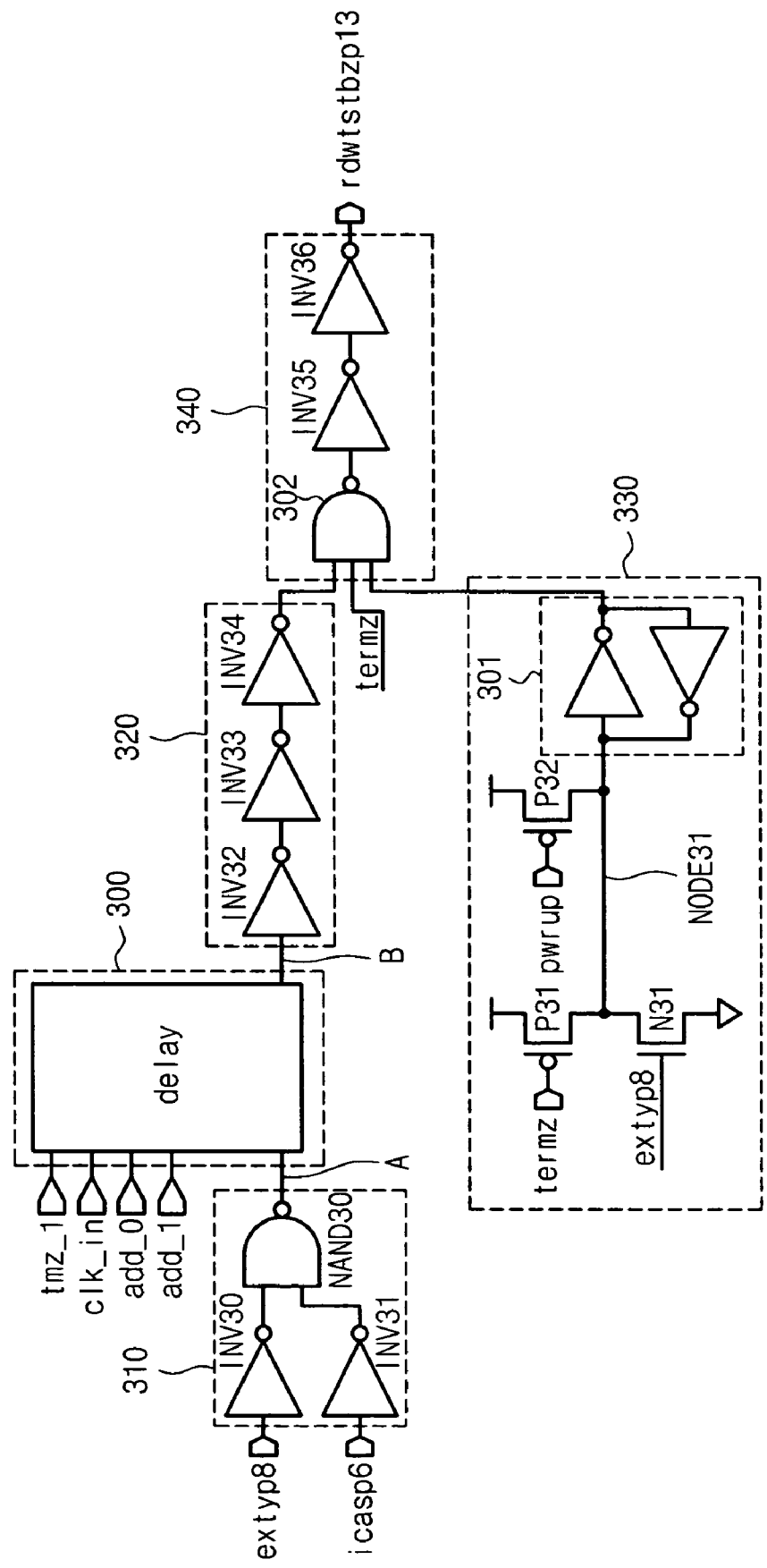
FIG. 3 is a circuit diagram of a read/write strobe pulse signal generating circuit according to an embodiment of the present invention.

FIG. 3 is a circuit diagram of a read/write strobe pulse signal generating circuit according to an embodiment of the present invention.

Figure 2A:
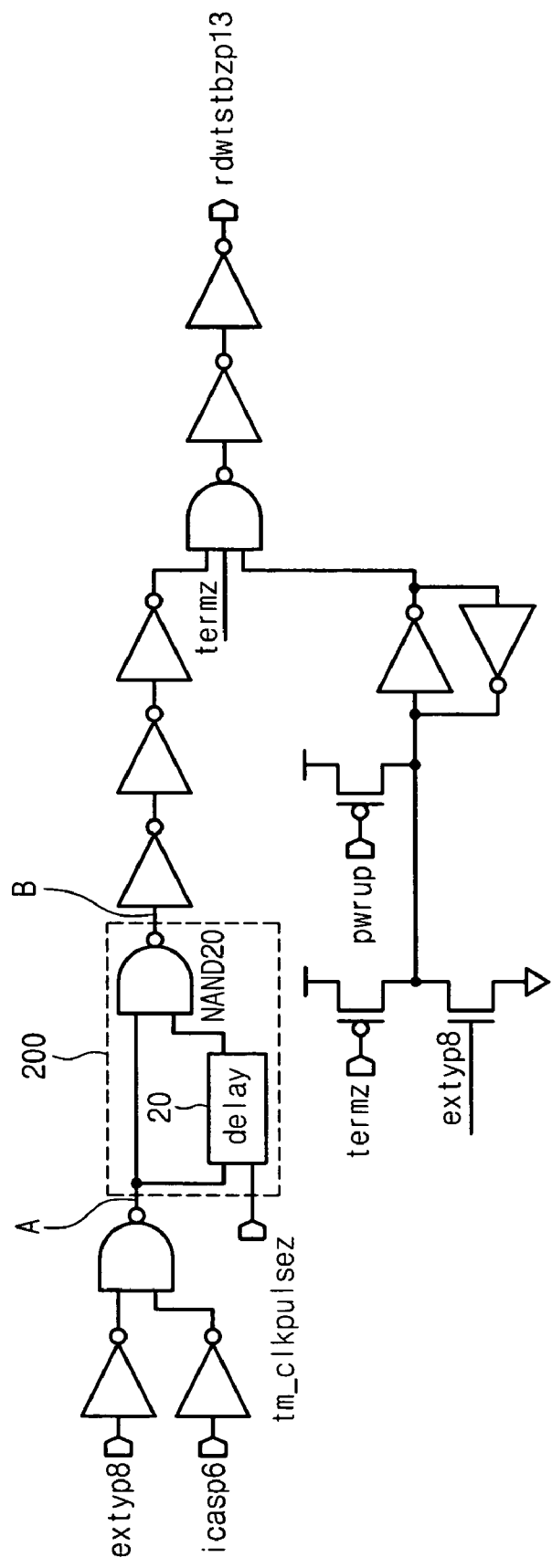
FIG. 2a is a circuit diagram of a conventional read/write strobe pulse generating circuit.

Unlike the conventional circuit of FIG. 2a, a pulse width adjustment unit 300 in the circuit of FIG. 3 is controlled by a clock signal clk_in.

The circuit of FIG. 3 includes an input signal receiving unit 310, a pulse width adjustment unit 300, a signal transfer unit 320, a test mode circuit unit 330, and an output unit 340.

The input signal receiving unit 310 includes inverters INV30 and INV31 and a NAND gate NAND30. The input signal extyp8 is applied to the inverter INV30, and an input signal icasp6 is applied to the inverter INV31. Output signals of the inverters INV30 and INV31 are applied to the NAND gate NAND30.

The pulse width adjustment unit 300 receives an output signal of the NAND gate NAND30, a test mode signal tmz_1, a clock signal clk_in, and address signals add_0 and add_1. The output signal of the NAND gate NAND30 is applied to the pulse width adjustment unit 300 through a node A, and after a predetermined delay time, it is output through a node B. At that time, the pulse width of the signal output to the node B can be changed using the clock signal clk_in. For reference, the tmz_1 signal is a control signal for determining the test mode. If the tmz_1 signal is in a low level, the circuit operates in a test mode, while if the signal is in a high level, the circuit operates in a normal operation mode. The add_0 and add_1 signals are external address signals that are used in the test mode. Functions performed by the respective signals will be explained in detail.

The signal transfer unit 320 receives the signal output from the pulse width adjustment unit, and includes buffering inverters INV32, INV33, and INV34.

The test mode circuit unit 330 includes transistors P31, P32 and N31 and a latch unit 301. Specifically, the test mode circuit unit 330 includes the PMOS transistor P31 and the NMOS transistor P32 connected in series between a power supply terminal and a ground terminal, the PMOS transistor P32 connected between the power supply terminal and a node NODE31, and the latch unit 301 for latching a signal from the node NODE31. Here, the term 'termz' denotes a signal used in a test mode, and the pwrup signal has already been explained with reference to FIG. 2a.

The output unit 340 includes a NAND gate 302 and inverters INV35 and INV36. The NAND gate 302 receives an output signal of the inverter INV34, the termz signal, and an output signal of the latch unit 301. Here, the termz signal serves to intercept the read/write strobe pulse signal rdwtstbzp13. An output signal of the NAND gate 302 is applied to the inverters INV35 and INV36 connected in series. An output of the inverter INV36 is the output signal of the output unit 340, which is the read/write strobe pulse signal rdwtstbzp13.

In the normal operation mode, the input signals extyp8 and icasp6 are output as the read/write strobe pulse signal after a predetermined time elapses. In this case, the pulse width adjustment unit 300 can adjust the pulse width of the read/write strobe pulse signal by adjusting the pulse width of the input signals extyp8 and icasp6 applied through a node A using the clock signal clk_in that is changed according to the variation of the operating frequency.

Figure 4:
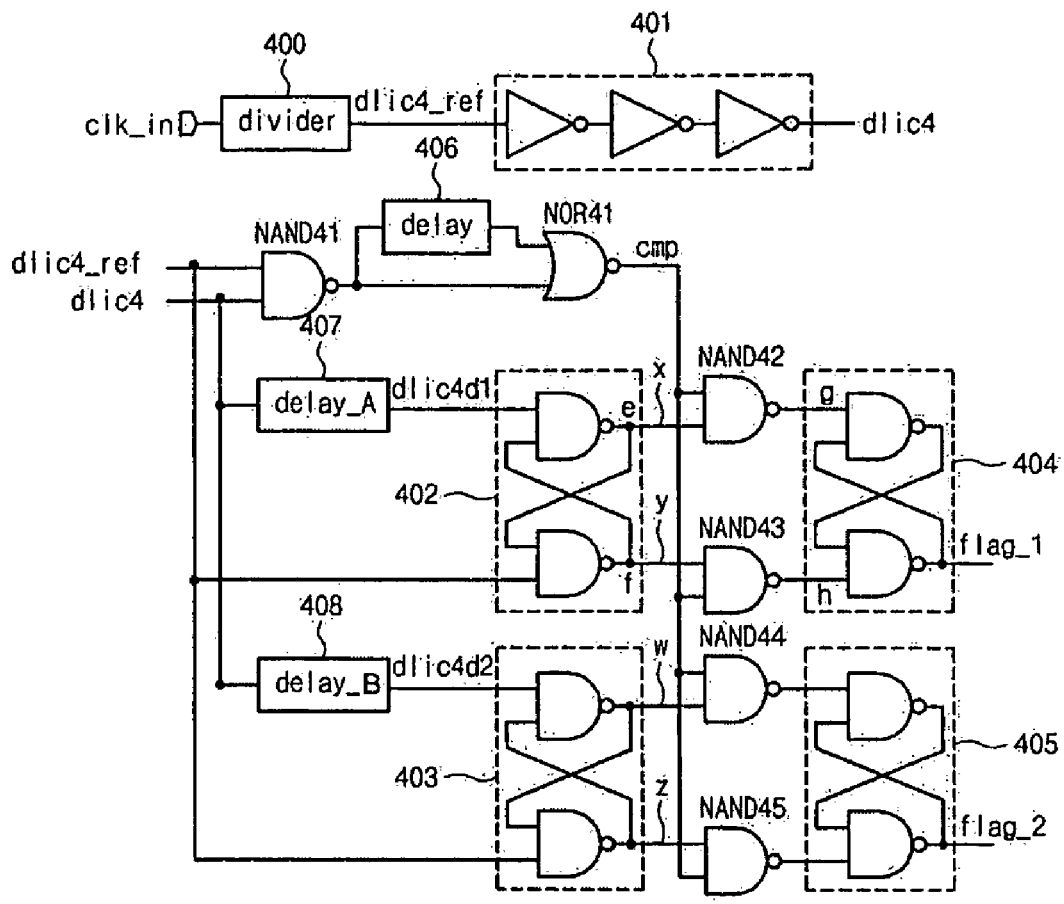
FIGS. 4 to 6 are circuit diagrams of a pulse width adjustment unit illustrated in FIG. 3.
Figure 4:
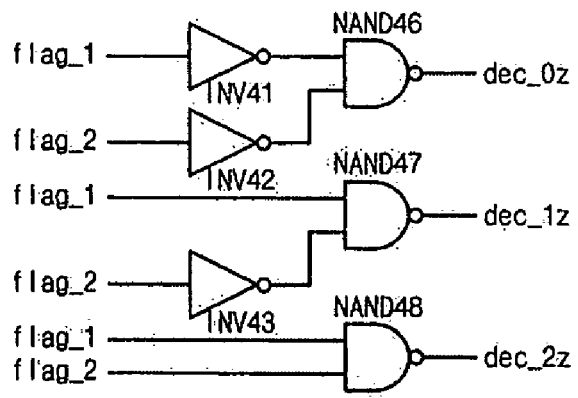
Figure 5:
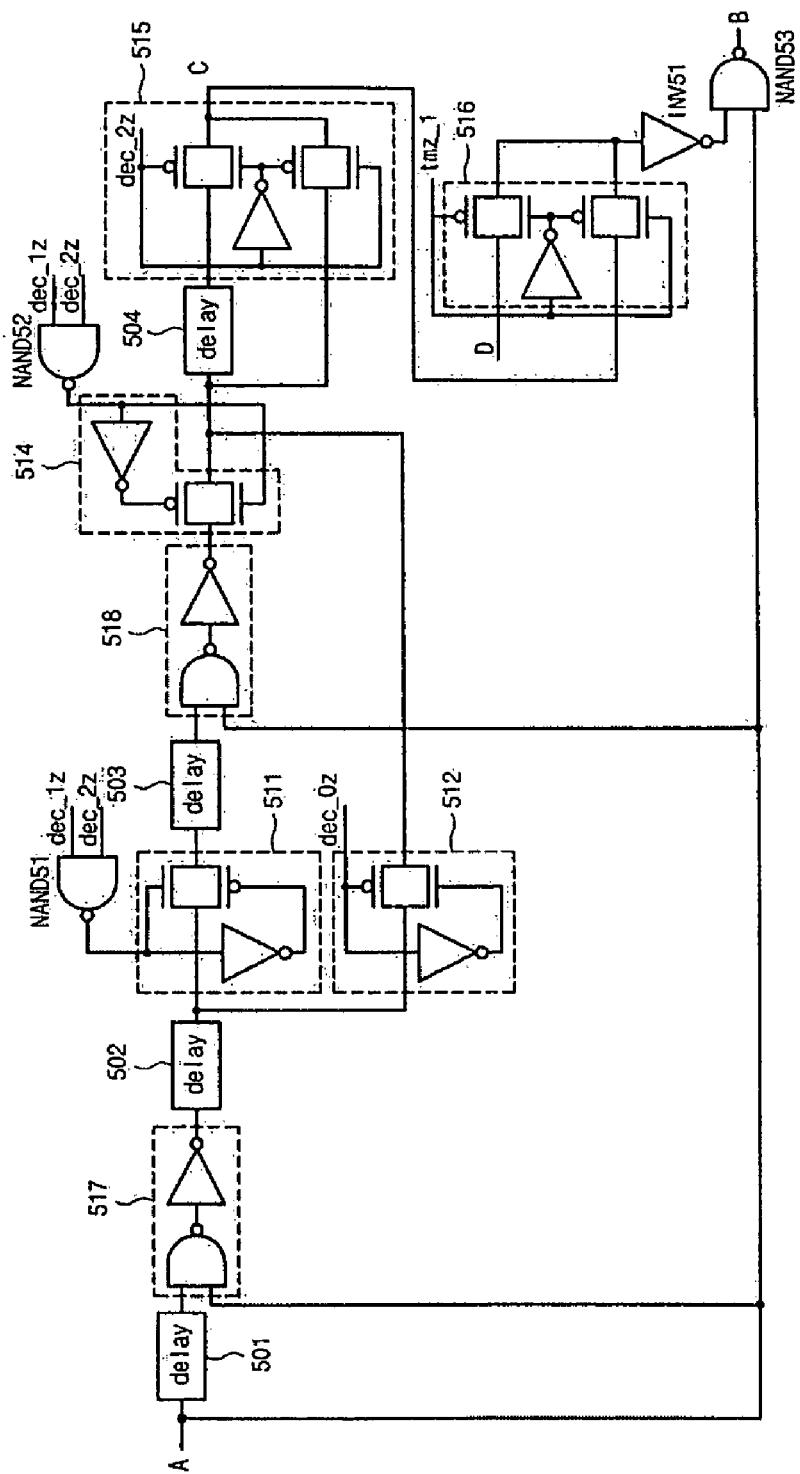
Figure 6:
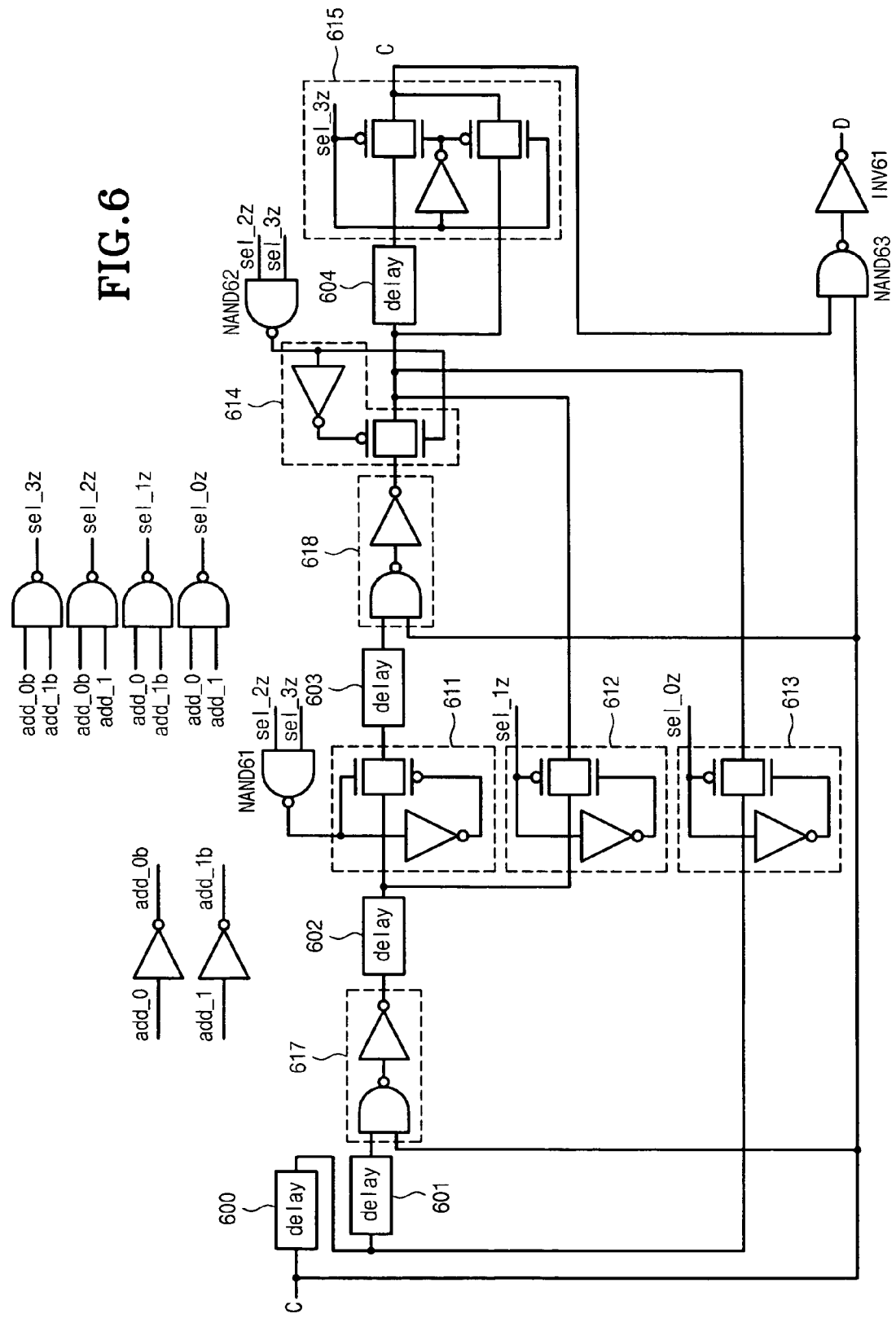

FIGS. 4 to 6 are circuit diagrams of examples of the pulse width adjustment unit illustrated in FIG. 3. As will be explained later, the clock signal clk_in is applied to the pulse width adjustment unit 300 in order to detect the operating frequency of the memory device. In the test mode, the test mode signal tmz_1 is applied to the pulse width adjustment unit 300. Also, in the test mode, the address signals add_0 and add_1 are applied to the pulse width adjustment unit 300 to achieve a delay tuning. For reference, nodes A and B of FIG. 3 correspond to nodes A and B of FIG. 5, respectively. Also, nodes C and D of FIG. 5 correspond to nodes C and D of FIG. 6.

Hereinafter, the circuits illustrated in FIGS. 4 to 6 will be explained in more detail.

FIG. 4 illustrates a circuit that receives the clock signal clk_in, and outputs signals dec_0z, dec_1z, and dec_2z for judging the range of the operating frequency of the memory device. More specifically, the circuit of FIG. 4 receives the clock signal clk_in, judges the operating frequency of the memory device by creating a plurality of internal signals dlic4_ref, dlic4, dlic4d1, dlic4d2, cmp, flag_1, and flag_2, and finally outputs the operating frequency judgment signals dec_0z, dec_1z, and dec_2z for judging the operating frequency of the memory device.

Figure 10:
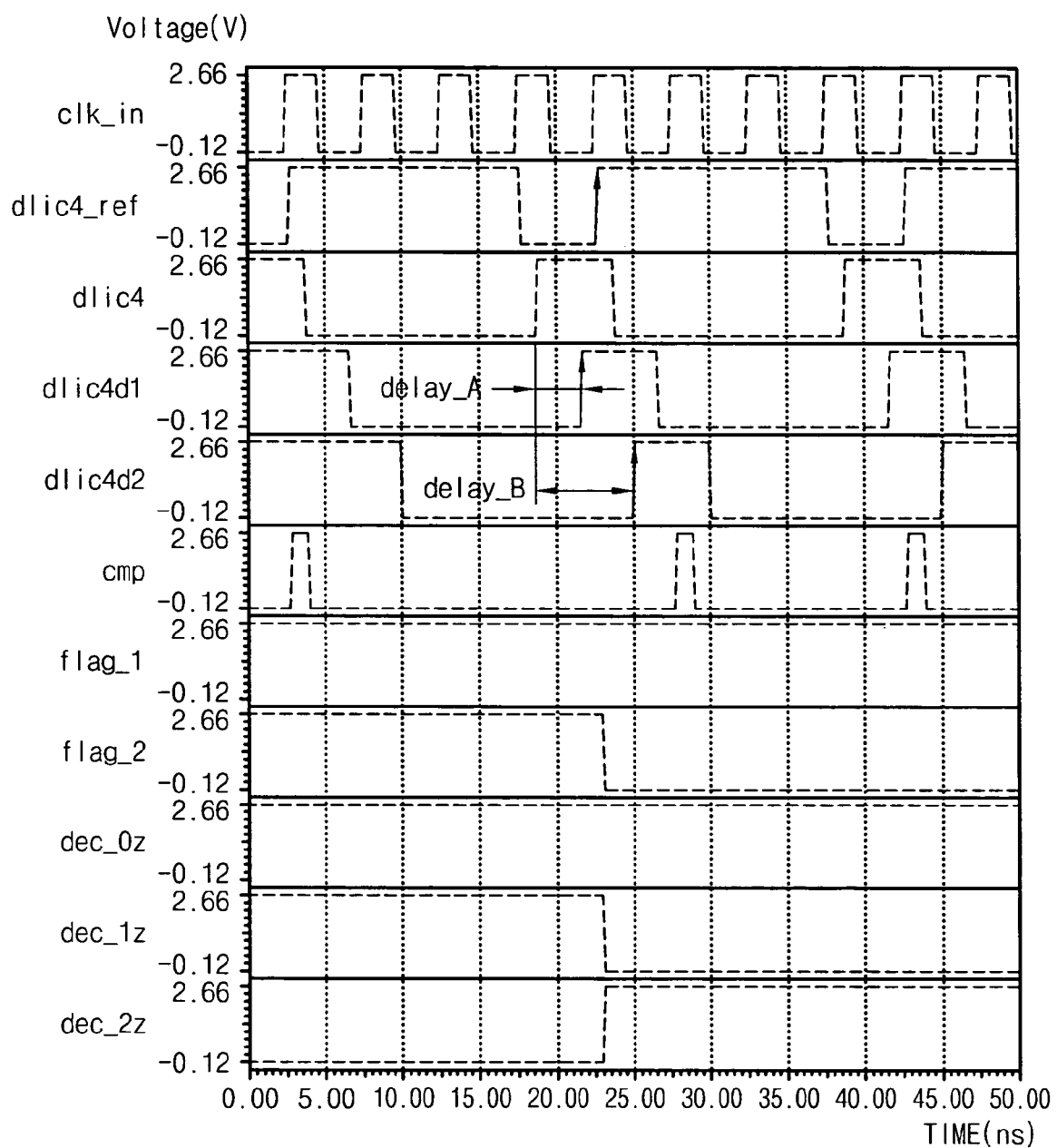
FIG. 10 is a waveform diagram of signals used in the circuit according to the present invention.

As illustrated in FIG. 4, the clock signal clk_in is input to a divider 400. The divider 400 outputs a divided signal dlic4_ref having a period longer than that of the clock signal clk_in. As illustrated in FIG 10, the period of the divided signal dlic4_ref is four times as long as the period tCK of the clock signal clk_in. In this case, a low-level section of the divided signal dlic4_ref is equal to the period tCK of the clock signal clk_in. However, according to circumstances, a manufacturer may adjust the period of the divided signal dlic4_ref. The divided signal dlic4_ref is applied to a buffer means 401 composed of inverters the number of which is odd, is delayed for a specified time, and then is output with its phase inverted. The phase-inverted divided signal is denoted as dlic4. The waveforms of the signals dlic4_ref and dlic4 are illustrated in FIG. 10.

Referring to FIG. 4, the divided signal dlic4_ref and the inverted divided signal dlic4 are applied to a NAND gate NAND41. An output signal of the NAND gate NAND41 is applied to a delay unit 406 and a NOR gate NOR41. The NOR gate NOR41 receives an output signal of the NAND gate NAND41 and an output signal of the delay unit 406, and outputs a pulse signal cmp. The output signal cmp of the NOR gate NOR41 is illustrated in FIG. 10. Additionally, the inverted divided signal dlic4 is applied to delay units delay_A and delay_B. In this case, delay times of the delay units delay_A and delay_B are different from each other. Output signals of the delay units delay_A and delay B_are denoted as dlic4d1 and dlic4d2, respectively.

The output signal dlic4d1 of the delay unit delay_A and the divided signal dlic4_ref are applied to a flip-flop circuit 402. The flip-flop 402 is composed of two NAND gates, and input/output terminals of the NAND gates cross each other. Output signals of the flip-flop 402 output through its two output terminals are denoted as X and Y.

The output signal dlic4d2 of the delay unit delay_B and the divided signal dlic4_ref are applied to a flip-flop circuit 403. The flip-flop 403 is composed of two NAND gates, and input/output terminals of the NAND gates cross each other. Output signals of the flip-flop 403 output through its two output terminals are denoted as W and Z.

Then, the NAND gate NAND42 receives the output signal cmp of the NOR gate NOR41 and the output signal X of the flip-flop 402. The NAND gate NAND43 receives the output signal cmp of the NOR gate NOR41 and the output signal Y of the flip-flop 402. The NAND gate NAND44 receives the output signal cmp of the NOR gate NOR41 and the output signal W of the flip-flop 403. The NAND gate NAND45 receives the output signal cmp of the NOR gate NOR41 and the output signal Z of the flip-flop 403.

The output signal of the NAND gate NAND42 and the output signal of the NAND gate NAND43 are applied to the flip-flop 404. The flip-flop 404 is composed of two NAND gates, and input/output terminals of the NAND gates cross each other. In FIG. 4, an output signal of a flip-flop 404 is indicated as a flag signal flag_1.

The output signal of the NAND gate NAND44 and the output signal of the NAND gate NAND45 are applied to a flip-flop 405. The flip-flop 405 is composed of two NAND gates, and input/output terminals of the NAND gates cross each other. In FIG. 4, an output signal of a flip-flop 405 is indicated as a flag signal flag_2.

For reference, if the delay time of a delay unit 407 is longer than that of a delay unit 408 (i.e., delay_A<delay_B), the logic levels of the flag signals are as follows.

If tCK<delay_A, the flag signals flag_A and flag_B are both in a low level. Here, tCK denotes the period of the clock signal clk_in.

If delay_A<tCK<delay_B, the flag signal flag_1 is in a high level, and the flag signal flag_2 is in a low level.

If tCK>delay_B, the flag signals flag_A and flag_B are both in a high level.

Referring to FIG. 4, the flag signals flag_A and flag_B are applied to the inverters INV41 and INV42, respectively. Respective output signals of the inverters INV41 and INV42 are applied to a NAND gate NAND46. The NAND gate NAND46 outputs an operating frequency judgment signal dec_0z.

Then, the flag signal flag_2 is applied to the inverter INV43. The output signal of the inverter INV43 and the flag signal flag_1 are applied to a NAND gate NAND47. The NAND gate NAND47 outputs an operating frequency judgment signal dec_1z.

Finally, the flag signals flag_1 and flag_2 are applied to a NAND gate NAND48. The NAND gate NAND48 outputs an operating frequency judgment signal dec_2z.

FIGS. 5 and 6 illustrate examples of the pulse width adjustment unit 300 illustrated in FIG. 3.

FIG. 5 illustrates a circuit that performs a method for controlling the delay time of the pulse width adjustment unit 300 using the operating frequency judgment signal dec_2z. FIG. 6 illustrates a delay circuit that is located between nodes C and D illustrated in FIG. 5 and that additionally tunes the amount of delay using the address signals add_0 and add_1 when the circuit enters into the test mode. That is, the circuit of FIG. 6 controls the additional delay amount using the address signals add_0 and add_1.

Hereinafter, the circuits of FIGS. 5 and 6 will be explained in more detail.

The circuit of FIG. 5 includes switching elements 511, 512, 514, 515, and 516 controlled by the operating frequency judgment signals dec_0z, dec_1z, and dec_2z. Each conversion modulation unit 517 or 518 is composed of a NAND gate and an inverter connected in series. The conversion units 517 and 518 each receive the signal on the node A through an input terminal.

In FIG. 5, the total delay time corresponds to a section from the node A to the node B. Here, the nodes A and B illustrated in FIG. 5 are the same as the nodes A and B illustrated in FIG. 3.

A signal input through the node A of FIG. 5 is an output signal of the input signal receiving unit 310, i.e., the extyp8 signal or the icasp6 signal.

Referring to FIG. 5, the turn-on/off operation of the switching elements 511 and 514 is controlled by the operating frequency judgment signals dec_1z and dec_2z. The turn-on/off operation of the switching element 512 is controlled by the operating frequency judgment signal dec_0z, and the turn-on/off operation of the switching element 515 is controlled by the operating frequency judgment signal dec_2z. The turn-on/off operation of the switching element 516 is controlled by the test mode signal tmz_1.

In operation, if an output signal of a NAND gate NAND51 that receives the operating frequency judgment signals dec_1z and dec_2z is in a high level, the switching elements 511 and 514 are turned on. Accordingly, the signal input through the node A passes through a delay unit 501, a conversion unit 517, delay units 502 and 503, a conversion unit 518, and the switching element 514. Here, the switching element 515 is controlled by the operating frequency judgment signal dec_2z. Accordingly, if the operating frequency judgment signal dec_2z is in a low level, the signal having passed through the switching element 514 is transferred to a node C via the delay unit 504. However, if the operating frequency judgment signal dec_2z is in a high level, the signal having passed through the switching element 514 is directly transferred to the node C.

In operation, if the switching element 512 is turned on by the operating frequency judgment signal dec_0z, the signal input through the node A passes through the delay unit 501, the conversion unit 517, and the switching element 512. If the operating frequency judgment signal dec_2z is in a low level, the signal having passed through the switching element 512 is transferred to the node C via the delay unit 504. However, if the operating frequency judgment signal dec_2z is in a high level, the signal having passed through the switching element 512 is directly transferred to the node C.

Next, the signal on the node C is transferred to the node B through the switching element 516. As can be seen in FIGS. 3, 5, and 6, the signal on the node C is transferred to a path C-B or to a path C-D-B.

Referring to FIG. 5, the switching element 516 is turned on/off by the test mode signal tmz_1. In the test mode, the test mode signal tmz_1 is kept in a low level. In the normal operation mode, the test mode signal tmz_1 is kept in a high level.

In the normal operation mode, the signal on the node C selectively passes through the path C-B. That is, the signal on the node C is transferred to the node B through the switching element 516, an inverter INV51, and a NAND gate NAND53. Here, the NAND gate NAND53 receives an output signal of the inverter INV51 and the signal on the node C.

In the test mode, however, the signal on the node C is transferred to a node D via the circuit illustrated in FIG. 6. The signal transferred to the node D is transferred to the node B through the switching element 516, the inverter INV51 and the NAND gate NAND53.

FIG. 6 illustrates an example of the circuit provided between the node C and the node B of FIG. 5. The circuit of FIG. 6 additionally adjusts the delay amount using the address signals in the test mode (in the case that the tmz_1 signal is in a low level).

The circuit of FIG. 6 includes a plurality of delay units 600, 601, 602, 603, and 604, switching elements 611, 612, 613, 614, and 615, and conversion units 617 and 618. Each of the conversion units 617 and 618 is composed of a NAND gate and an inverter connected in series. The signal of the node C is input through input terminals of the conversion unit 617 and 618. In FIG. 6, the total delay time corresponds to a section from the node C to the node D. Here, the nodes C and D illustrated in FIG. 6 are the same as the nodes C and D illustrated in FIG. 5. As will be explained later, a NAND gate NAND63 of FIG. 6 receives the signal of the node C through its input terminal.

In FIG. 6, the address signals having passed through the inverters are indicated as address bar signals add_0b and add_1b. As can be seen in FIG. 6, selection signals sel_3z, sel_2z, sel_1z, and sel_0z for controlling the turn-on/off of the switching elements are made by combination of the address signals.

As can be seen in FIG. 6, if the address signals add_0 and add_1 are low and low, respectively, the selection signal sel_3z is enabled to a low level. If the address signals add_0 and add_1 are low and high, respectively, the selection signal sel_2z is enabled to a low level. If the address signals add_0 and add_1 are high and low, respectively, the selection signal sel_1z is enabled to a low level. If the address signals add_0 and add_1 are high and high, respectively, the selection signal sel_0z is enabled to a low level.

Referring to FIG. 6, the turn-on/off operation of the switching elements 611 and 614 is controlled by the selection signals sel_2z and sel_3z. The turn-on/off operation of the switching element 612 is controlled by the selection signal sel_1z. The turn-on/off operation of the switching element 613 is controlled by the selection signal sel_0z. The turn-on/off operation of the switching element 615 is controlled by the selection signal sel_3z.

In operation, if the selection signals sel_2z and sel_3z are low and low, respectively, an output signal of the NAND gate NAND61 that receives the selection signals Sel_2z and sel_3z becomes high. Accordingly, the switching elements 611 and 614 are turned on, and the signal input through the node C passes through the delay units 600 and 601, the conversion unit 617, the delay units 602 and 603, and the conversion unit 618. Here, if the selection signal sel_3z is in a low level, the signal having passed through the delay unit 603 is transferred to the node C through the delay unit 604, the NAND gate NAND63, and the inverter INV61. If the selection signal sel_3z is in a high level, the signal having passed through the delay unit 603 is transferred to the node D through the NAND gate NAND63 and the inverter INV61. Accordingly, if the selection signals sel_2z and sel_3z are low and low, respectively, the signal having passed through the delay unit 603 is transferred to the node D through the delay unit 604, the NAND gate NAND63 and the inverter INV61.

In operation, if the selection sel_1z is low, the switching element 612 is turned on. Accordingly, the signal input through the node C passes through the delay units 600 and 601, the conversion unit 617, and the delay unit 602. In this case, because the selection signal sel_3z is in a high level, the signal having passed through the delay unit 602 is transferred to the node D through the NAND gate NAND63 and the inverter INV61. As is illustrated, the NAND gate NAND63 receives the signal having passed through the switching element 615 and the signal of the node C.

In operation, if the selection sel_0z is low, the switching element 613 is turned on. Accordingly, the signal input through the node C passes through the delay unit 600. In this case, because the selection signal sel_3z is in a high level, the signal having passed through the delay unit 600 is transferred to the node D through the NAND gate NAND63 and the inverter INV61. Here, the NAND gate NAND63 receives the signal having passed through the switching element 615 and the signal of the node C.

As can be seen in FIG. 6, in the test mode, the delay time corresponding to the section from the node C to the node D can be adjusted using the selection signals generated by the combination of the external address signals add_0 and add_1. For example, if the test mode signal tmz_1 is in a high level, the delay obtained through the path C-D is intercepted. However, if the test mode signal tmz_1 is in a low level, the path C-D is open, and thus the delay path C-D and the delay time can be adjusted according to the address signals.

Figure 7:
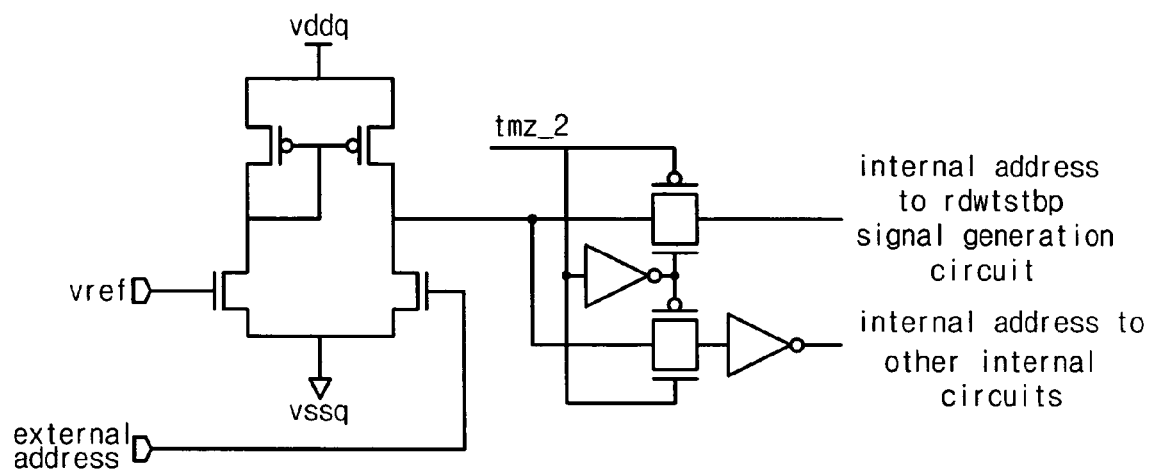
FIG. 7 is a circuit diagram of an address buffer according to an embodiment of the present invention.

FIG. 7 is a circuit diagram of an address buffer according to an embodiment of the present invention.

As illustrated in FIG. 7, if the test mode signal tmz_2 is enabled to a low level, the addresses applied from the outside are applied to a read/write strobe pulse signal generator. That is, in the test mode, the addresses add_0 and add_1 are applied from the address buffer illustrated in FIG. 7.

Referring to FIG. 7, if the test mode signal tmz_2 is in a high level (i.e., in a normal operation mode), the addresses applied from the outside are normally applied to the internal circuits that require the address signals.

Figure 8:
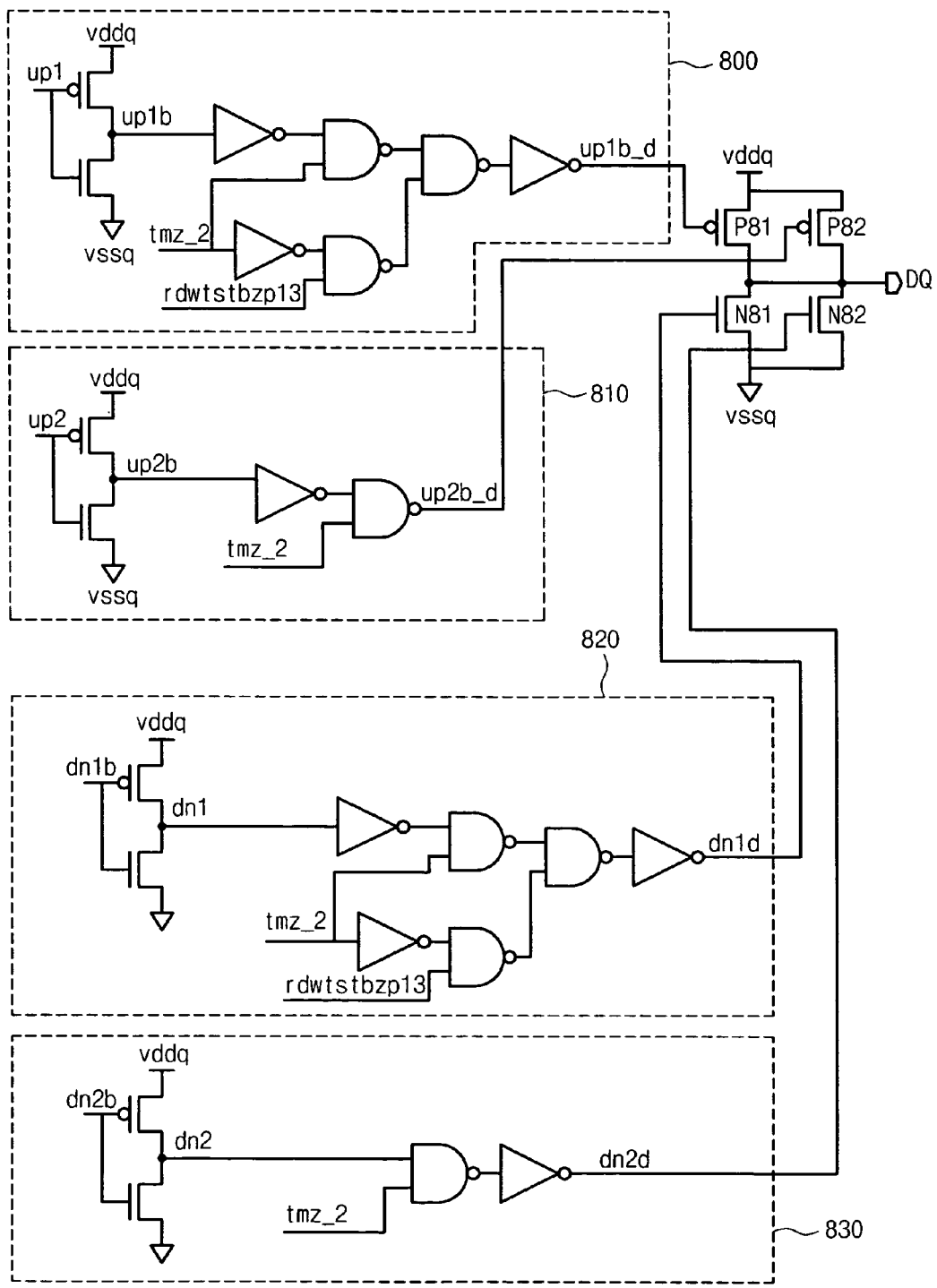
FIG. 8 is a circuit diagram of a data output buffer according to an embodiment of the present invention.

FIG. 8 is a circuit diagram of a data output buffer according to an embodiment of the present invention.

The data output buffer of FIG. 8 includes a first pull-up driver 800, a first pull-down driver 820, a second pull-up driver 810, a second pull-down driver 830, pull-up transistors P81 and P82, and pull-down transistors N81 and N82.

Referring to FIG. 8, an output signal of the first pull-up driver 800 is applied to a gate of the pull-up transistor P81. An output signal of the first pull-down driver 820 is applied to a gate of the pull-down transistor N81. An output signal of the second pull-up driver 810 is applied to a gate of the pull-up transistor P82. An output signal of the second pull-down driver 830 is applied to a gate of the pull-down transistor N82. The pull-up transistor P81 and the pull-down transistor N81 are connected in series between the power supply vddq and ground vssq. Also, the pull-up transistor P82 and the pull-down transistor N82 are connected in series between the power supply vddq and ground vssq.

As can be seen in FIG. 8, in the test mode (i.e., when the test mode signal tmz_2 is in a low level), the first pull-up driver 800 transfers the read/write strobe pulse signal rdwtstbzp13 to the gate of the pull-down transistor N81. Accordingly, through a data pin DQ, the read/write strobe pulse signal can be monitored in a packaged state of the memory device.

In the normal operation mode (i.e., the test mode signal tmz_2 is in a high level), the second pull-up driver 810 transfers an internal data signal up2b_d to the gate of the pull-up transistor P82. In the same manner, the second pull-down driver 830 transfers an internal data signal dn2_d to the gate of the pull-down transistor N82 in the normal operation mode. Accordingly, the internal data information can be read through the data pin DQ.

In FIG. 8, the reason why two pull-up transistors and two pull-down transistors are provided is that the pull-up and pull-down transistors for driving the data should have a large size and the pull-up and pull-down transistors for driving the read/write strobe pulse signal do not require such a large size. That is, in the test mode, the power consumption is reduced through using of the pull-up and pull-down transistors having a small size. In addition to the embodiment of the present invention described above, it is also possible to use one pull-up transistor and one pull-down transistor according to the present invention.

Figure 9:
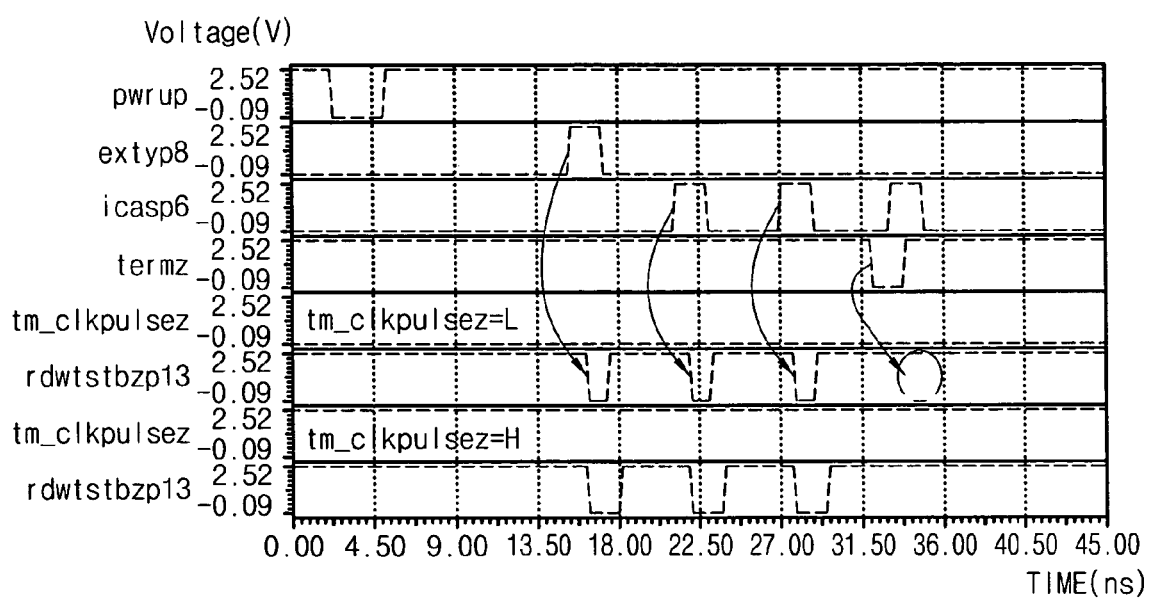

FIG. 9 is a waveform diagram explaining the operation of the conventional circuit illustrated in FIG. 2a.

As can be seen in FIG. 9, the conventional circuit can just adjust the pulse width of the output signal rdwtstbzjp13 according to the logic level of the tm_clkpulsez signal.

FIG. 10 is a waveform diagram of signals used in the circuit according to the present invention. Particularly, FIG. 10 illustrates the waveforms of the signals used in the circuit of FIG. 4 such as the clock signal clk_in, the divided signal dlic4_ref, the inverted divided signal dlic4, the delay signals dlic4d1 and dlic4d2, the pulse signal cmp, the flag signals flag_1 and flag_2, and the operating frequency judgment signals dec_0z, dec_1z, and dec_2z.

Referring to FIG. 10, the period of the divided signal dlic4_ref is four times as long as that of tCK. The low-level section of the divided signal dlic4_ref is the same as tCK. The inverted divided signal dlic4 has a phase opposite to the divided signal dlic4_ref, and is outputted after a predetermined delay time.

The inverted divided signal dlic4 is input to the delay unit having a delay time delay_A, and a delayed signal dlic4d1 is output from the delay unit. Additionally, the inverted divided signal dlic4 is input to the delay unit having a delay time delay_B, and a delayed signal dlic4d2 is output from the delay unit. In this case, the high-level section of the inverted divided signal clic4 and the delayed signals dlic4d1 and dlic4d2 is the same as tCK. In this case, delay_A<delay_B as can be seen in FIG. 8.

Hereinafter, signal waveforms of FIG. 10 will be explained in more detail with reference to the circuit of FIG. 4.

If the divided signal dlic4_ref, the delayed signal dlic4d1, and the pulse signal are all in a low level, the initial values on the nodes e, f, g, and h as illustrated in FIG. 4 are all in a high level. In this state, if the delayed signal dlic4d1 is changed to a high level earlier than the divided signal dlic4_ref, the node e is transited to a low level. Then, if the pulse signal is transited to a high level, the node e is transited to a low level. Then, if the pulse signal amp is transited to a high level, the node h is transited to a low level. Accordingly, the flag signal flag_1 goes to a high level.

By contrast, if the divided signal dlic4_ref is transited to a high level earlier than the delayed signal dlic4d1, the node f is transited to a low level. Then, if the pulse signal cmp is transited to a high level, the node g is transited to a low level. Accordingly, the flag signal flag_1 goes to a low level.

As described above, what is important in the circuit of FIG. 4 is that the logic level of the flag signal flag_1 is determined according to which signal between the two signals dlec4_ref and dlic4d1 to be compared with each other is first transited to a high level before the pulse signal cmp is transited to a high level.

The generation of the flag signal flag_2 is the same as that of the flag signal flag_1, the additional explanation thereof will be omitted.

The delay amount indicated as delay_A or delay_B is to judge the frequency range of the clock signal clk_in. For example, as illustrated in FIG. 10, the fact that a rising edge of the delayed signal dlic4d1 is earlier than a rising edge of the divided signal dlic4-ref indicates that the delay amount delay_A is smaller than the period of the clock signal clk_in. In the same manner, the fact that a rising edge of the delayed signal dlic4d2 is later than a rising edge of the divided signal dlic4-ref indicates that the delay amount delay_B is larger than the period of the clock signal clk_in. In this case, it is set that delay_A<tCK<delay_B. FIG. 10 illustrates the signal waveforms in the case that the above-described condition is satisfied.

Figure 11:
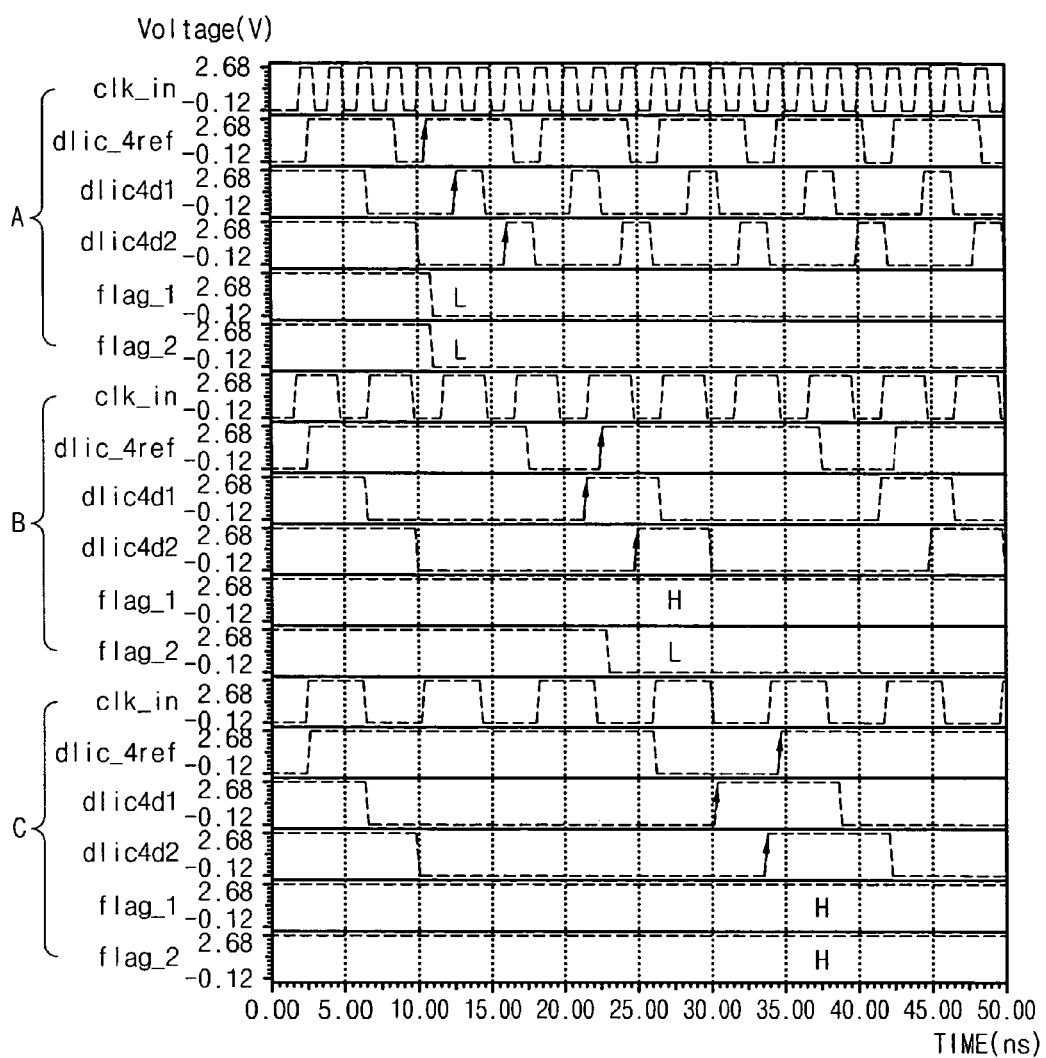
FIG. 11 is a waveform diagram explaining a process that the logic levels of flag signals are changed according to the frequency of a clock signal.

FIG. 11 is a waveform diagram explaining a process that the logic levels of the flag signals flag_1 and flag_2 are changed according to the frequency of the clock signal clk_in. In FIG. 11, the condition of delay_A<delay_B is satisfied.

As illustrated as a part A in FIG. 11, if it is set that tCK<delay_A, the flag signals flag_1 and flag_2 are all in a low level.

As illustrated as a part B in FIG. 11, if it is set that delay_A<tCK<delay_B, the flag signal flag_1 is in a high level and the flag signal flag_2 is in a low level.

As illustrated as a part C in FIG. 11, if it is set that tCK>delay_B, the flag signals flag_1 and flag_2 are all in a high level.

As described above, it can be seen that the flag signals include the operating frequency information of the memory device. According to the flag signals, the logic levels of the operating frequency judgment signals dec_0z, dec_1z, and dec_2z are determined. Additionally, according to the logic levels of the operating frequency judgment signals dec_0z, dec_1z, and dec_2z, the delay path of the circuit as illustrated in FIG. 5 is determined.

Figure 12:
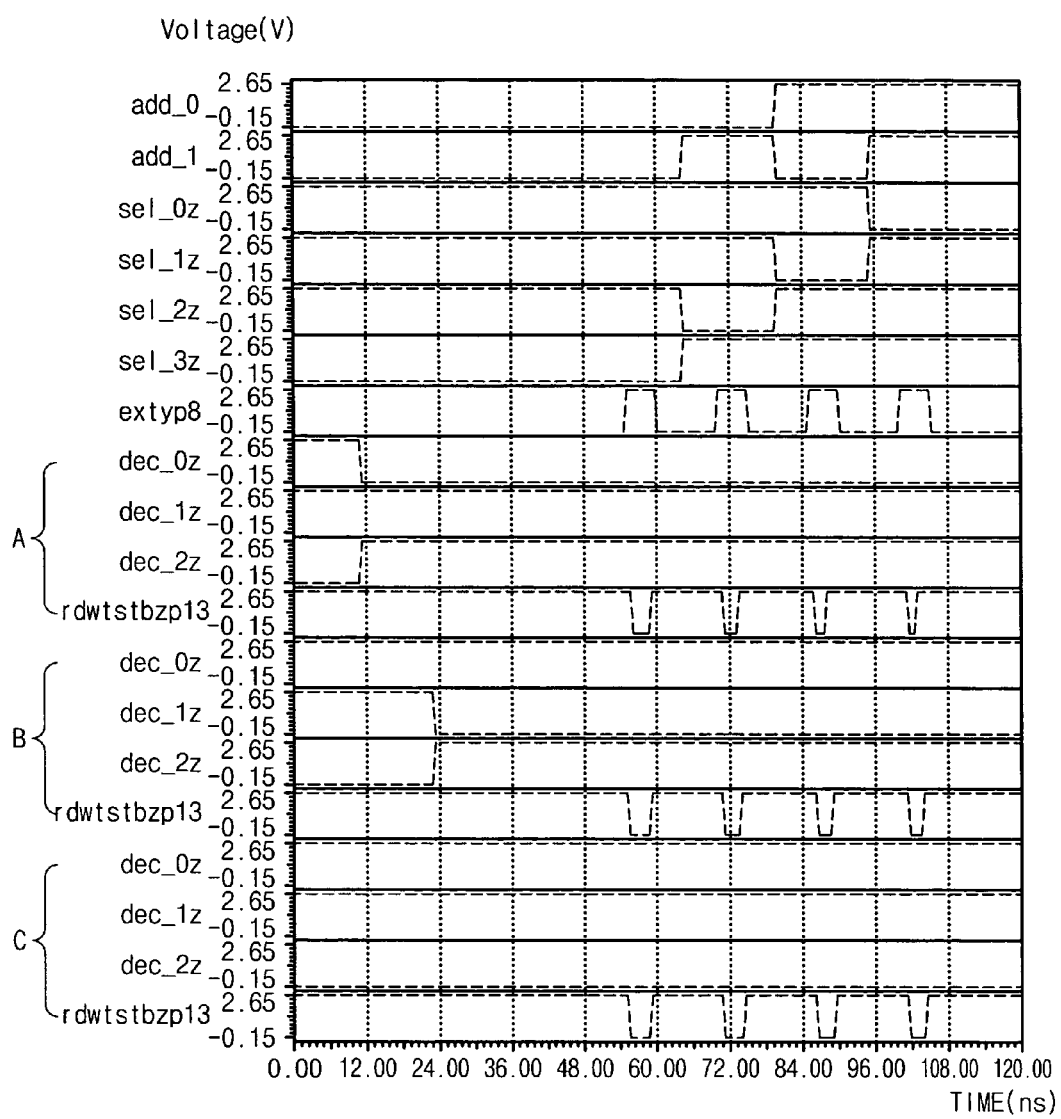
FIG. 12 is a waveform diagram of output signals produced when a path C-D as illustrated in FIG. 6 is used.

FIG. 12 is a waveform diagram of the output signal rdwtstbzp13 produced when the path C-D as illustrated in FIG. 6 is used. As described above, the circuit of FIG. 6 is a circuit used when the circuit enters into the test mode according to the test mode signal tmz_1 as illustrated in FIG. 5. That is, in the test mode, the delay amount can additionally be adjusted by applying the address signals to the circuit in which the frequency path has been determined.

As was explained in FIG. 6, the selection signals sel_3z, sel_2z, sel_1z, and sel_0z set by the combination of the address signals are illustrated in FIG. 12.

A part A in FIG. 12 refers to the waveforms of the input signal extyp8 and the output signal rdwtstbzp13 when the operating frequency judgment signals dec_2z and dec_1z are in a high level and the operating frequency judgment signal dec_0z is in a low level.

A part B in FIG. 12 refers to the waveforms of the input signal extyp8 and the output signal rdwtstbzp13 when the operating frequency judgment signals dec_0z and dec_2z are in a high level and the operating frequency judgment signal dec_1z is in a low level.

A part C in FIG. 12 refers to the waveforms of the input signal extyp8 and the output signal rdwtstbzp13 when the operating frequency judgment signals dec_0z and dec_1z are in a high level and the operating frequency judgment signal dec_2z is in a low level.

As can be known from the part A, B, and C, as the delay path of FIG. 6 is shortened through the adjustment of the address signals, the pulse width of the output signal rdwtstbzp13 is reduced.

Figure 13:
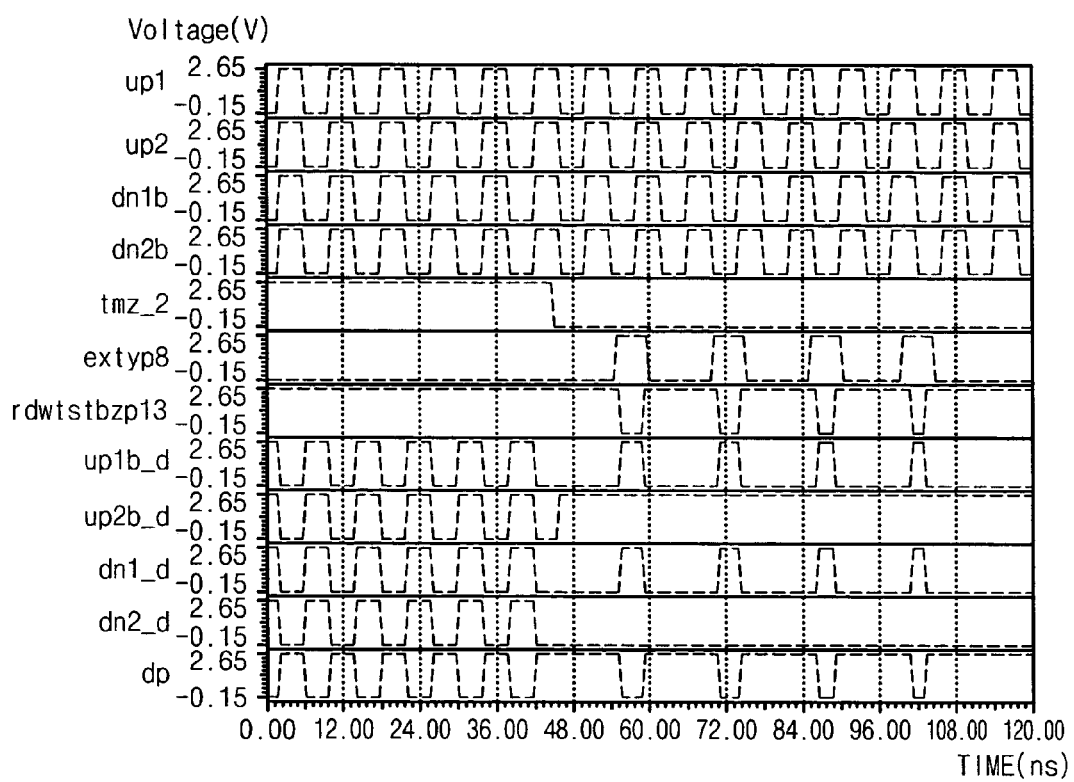
FIG. 13 is a waveform diagram of signals used in a data output buffer of FIG. 8.

FIG. 13 is a waveform diagram of the signals used in the data output buffer of FIG. 8.

As illustrated in FIG. 13, in the test mode, the read/write strobe pulse signal is output through the data pins, and in the normal operation mode, the internal data is output through the data pins.

Figure 14:
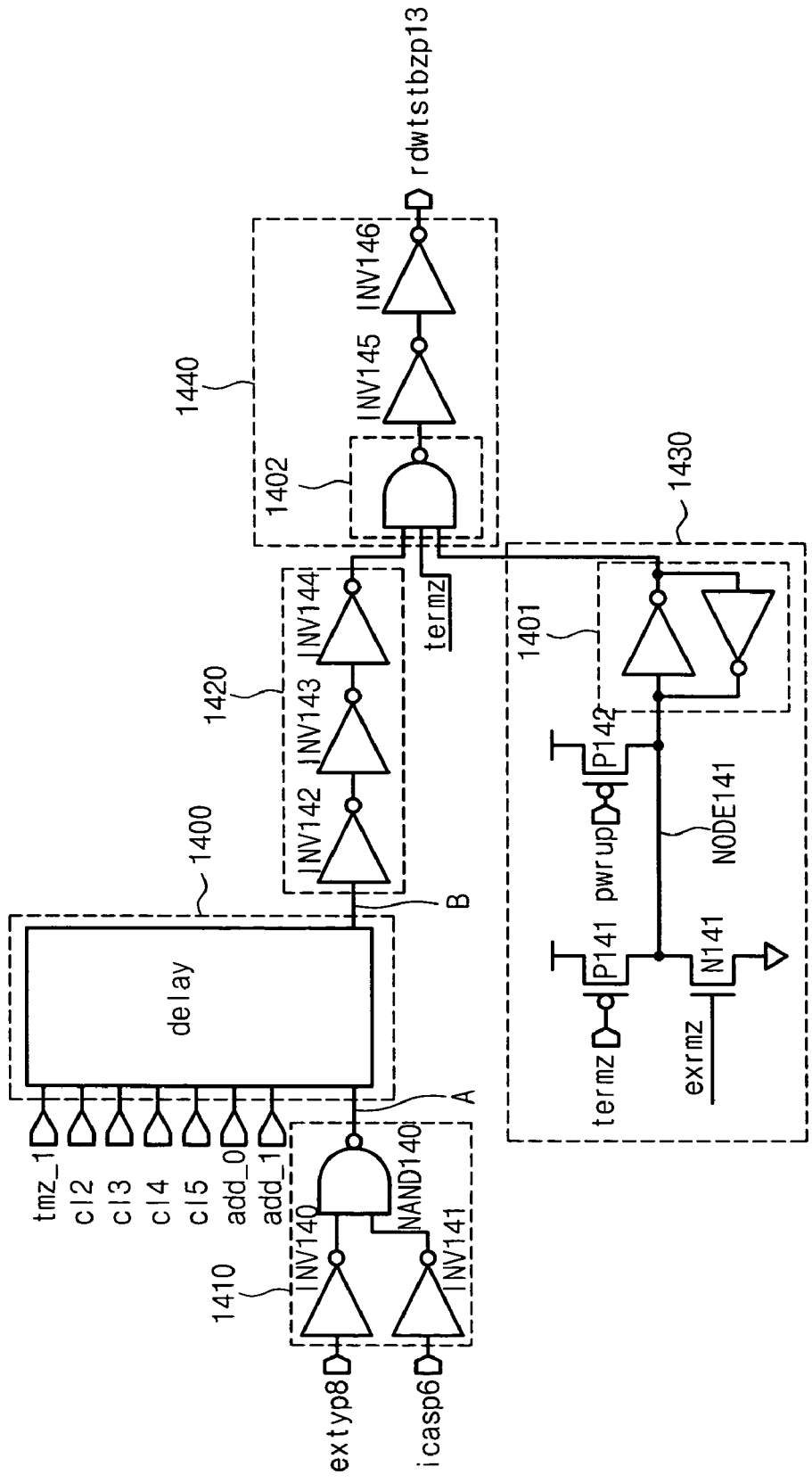
FIG. 14 is a circuit diagram of a read/write strobe pulse signal generating circuit according to another embodiment of the present invention.

FIG. 14 is a circuit diagram of the read/write strobe pulse signal generating circuit according to another embodiment of the present invention.

Unlike the circuit of FIG. 2, the pulse width adjustment unit 1400 in the circuit of FIG. 14 is controlled by the CAS latency and the address signals.

The circuit of FIG. 14 includes an input signal receiving unit 1410, a pulse width adjustment unit 1400, a signal transfer unit 1420, a test mode circuit unit 1430, and an output unit 1440.

The input signal receiving unit 1410 includes inverters INV140 and INV141 and a NAND gate NAND140. The input signal extyp8 is applied to the inverter INV140, and the input signal icasp6 is applied to the inverter INV141. Output signals of the inverters INV140 and INV141 are applied to the NAND gate NAND140.

The pulse width adjustment unit 1400 receives an output signal of the NAND gate NAND140, the test mode signal tmz_1, the clock signal clk_in, and the address signals add_0 and add_1. The output signal of the NAND gate NAND140 is applied to the pulse width adjustment unit 1400 through a node A, and after a predetermined delay time, it is output through a node B. At that time, the pulse width of the signal output to the node B can be changed using the CAS latencies cl2, cl3, cl4, and cl5. For reference, the tmz_1 signal is the control signal for determining the test mode. If the tmz_1 signal is in a low level, the circuit operates in a test mode, while if the signal is in a high level, the circuit operates in a normal operation mode. The term "cl2" denotes that the CAS latency is 2, "cl3" denotes that the CAS latency is 3, "cl4" denotes that the CAS latency is 4, and "cl5" denotes that the CAS latency is 5. Generally, if the operating frequency of the memory device is increased, the CAS latency is also increased. The terms "add__0" and "add__1" denote the external address signals that are used in the test mode. Functions performed by the respective signals will be explained in detail.

The signal transfer unit 1420 receives the signal output from the pulse width adjustment unit, and includes buffering inverters INV142, INV143, and INV144.

The test mode circuit unit 1430 includes transistors P141, P142 and N141 and a latch unit 1401. Specifically, the test mode circuit unit 1430 includes the PMOS transistor P141 and the NMOS transistor P142 connected in series between the power supply terminal and the ground terminal, the PMOS transistor P142 connected between the power supply terminal and a node NODE141, and the latch unit 1401 for latching a signal from the node NODE141. Here, the term 'termz' denotes a signal used in the test mode, and the pwrup signal has already been explained with reference to FIG. 2a.

The output unit 1440 includes a NAND gate 1402 and inverters INV145 and INV146. The NAND gate 1402 receives an output signal of the inverter INV144, the termz signal, and an output signal of the latch unit 1401. An output signal of the NAND gate 1402 is applied to the inverters INV145 and INV146 connected in series. An output signal of the inverter INV146 is the output signal of the output unit 1440, which is the read/write strobe pulse signal rdwtstbzp13.

In the normal operation mode, the input signals extyp8 and icasp6 are output as the read/write strobe pulse signal after a predetermined time elapses. In this case, the pulse width adjustment unit 1400 can adjust the pulse width of the read/write strobe pulse signal by adjusting the pulse width of the input signals extyp8 and icasp6 applied through a node A using the CAS latency that is changed according to the variation of the operating frequency.

Figure 15:
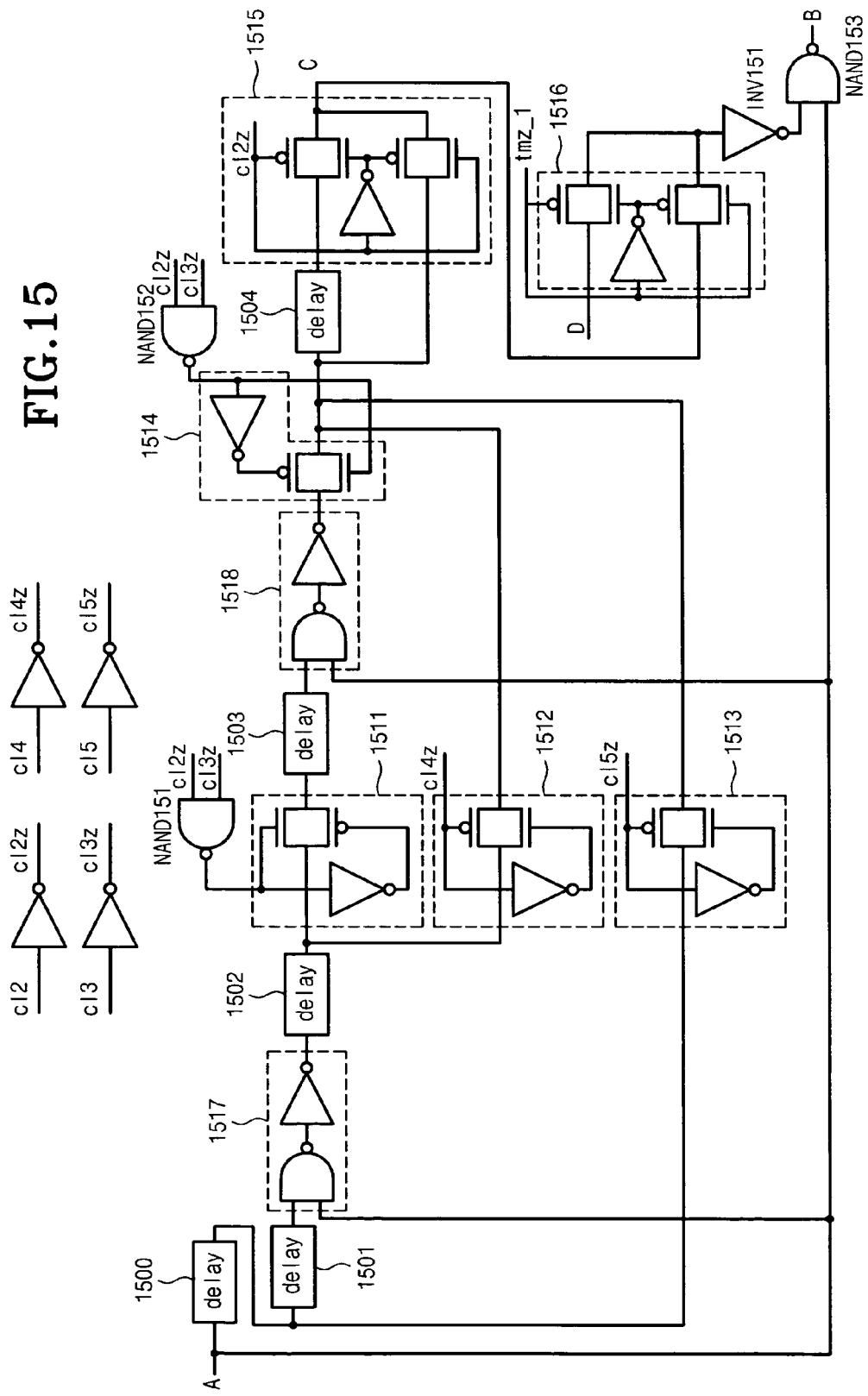
FIGS. 15 and 16 are circuit diagrams of a pulse width adjustment unit illustrated in FIG. 14.
Figure 16:
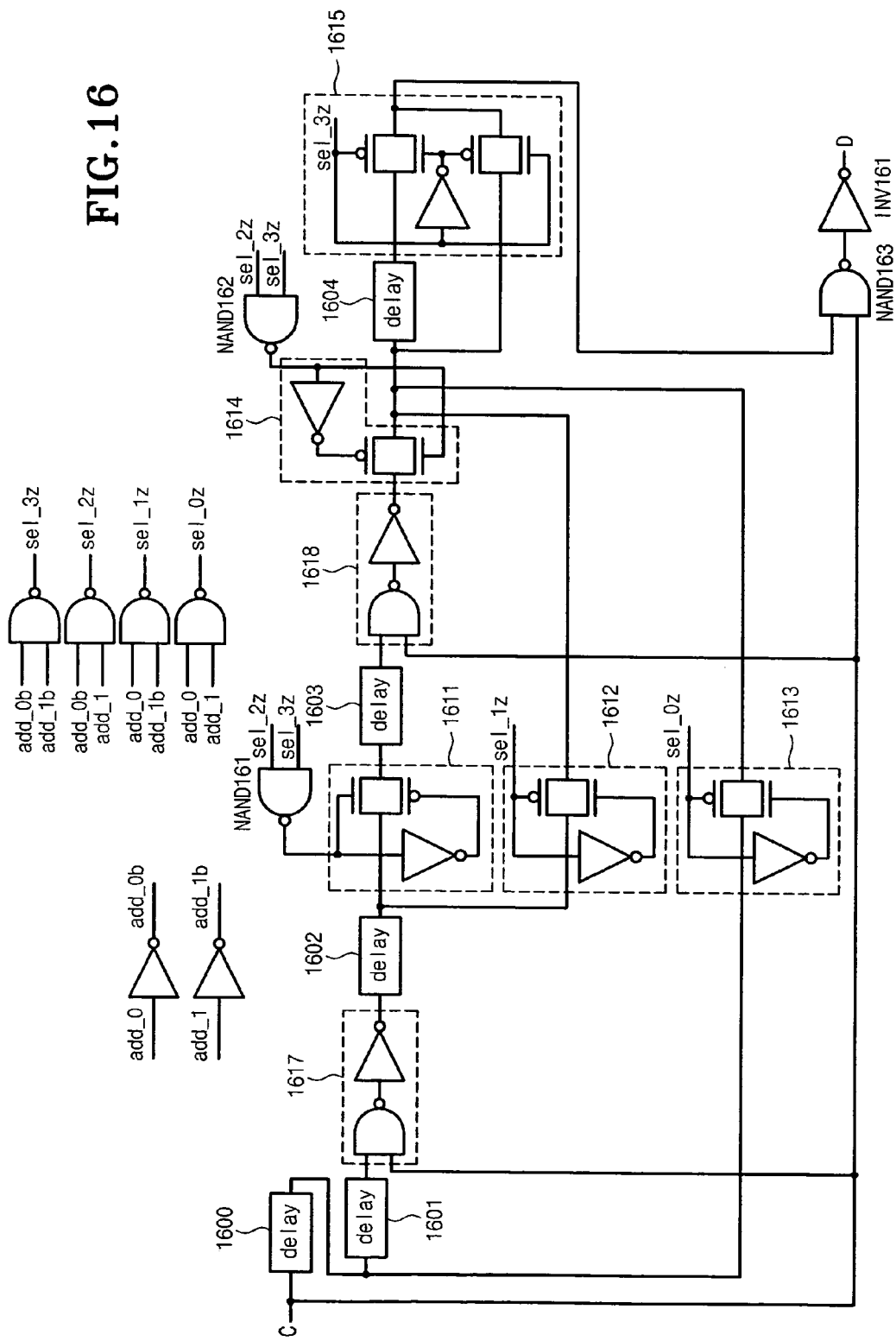

FIGS. 15 to 16 are circuit diagrams of examples of the pulse width adjustment unit 1400 illustrated in FIG. 14.

FIG. 15 illustrates a circuit that performs a method for controlling the delay time of the pulse width adjustment unit 1400 by the CAS latency signals cl2, cl3, cl4, and cl5. FIG. 16 illustrates a delay circuit, provided between the nodes C and D, for additionally tuning the delay amount determined by the CAS latency signals using the address signals add_0 and add_1 when the circuit enters into the test mode. That is, the circuit of FIG. 16 controls the additional delay amount using the address signals add_0 and add_1.

Hereinafter, the circuits of FIGS. 15 and 16 will be explained in more detail.

The circuit of FIG. 15 includes a plurality of delay units 1500, 1501, 1502, 1503, and 1504 and switching elements 1511, 1512, 1513, 1514, 1515, and 1516 controlled by the CAS latency signals cl2, cl3, cl4, and cl5. Each of conversion units 1517 and 1518 is composed of a NAND gate and an inverter connected in series.

In FIG. 15, the total delay time corresponds to a section from the node A to the node B. Here, the nodes A and B illustrated in FIG. 15 are the same as the nodes A and B illustrated in FIG. 14.

In FIG. 15, a signal input through the node A of FIG. 15 is an output signal of the input signal receiving unit 1410, i.e., the extyp8 signal or the icasp6 signal.

Referring to FIG. 15, the turn-on/off operation of the switching elements 1511 and 1514 is controlled by the CAS latency signals cl2z and cl3z. The turn-on/off operation of the switching element 1512 is controlled by the CAS latency signal cl4z, and the turn-on/off operation of the switching element 1515 is controlled by the CAS latency signal cl5z. The turn-on/off operation of the switching element 1516 is controlled by the test mode signal tmz_1.

In operation, if the CAS latency is 2 or 3 (i.e., if cl2 or cl3 is in a high level), an output signal of a NAND gate NAND151 that receives the CAS latency signal clz2 and clz3 is in a high level, and thus the switching element 1511 and 1514 are turned on. Accordingly, the signal input through the node A passes through delay units 1500 and 1501, a conversion unit 1517, delay units 1502 and 1503, and a conversion unit 1518. Here, the switching element 1515 is controlled by the CAS latency cl2z. Accordingly, if the CAS latency cl2z is in a low level, the signal having passed through the switching element 1514 is transferred to a node C via the delay unit 1504. However, if the CAS latency cl2z is disabled, the signal having passed through the switching element 1514 is directly transferred to the node C.

In operation, if the CAS latency is 4 (i.e., if cl4 is in a high level), the switching element 1512 is turned on. Accordingly, the signal input through the node A passes through the delay units 1500 and 1501, the conversion unit 1517, and the delay unit 1502. Here, because the CAS latency is 4, the signal having passed through the delay unit 1502 cannot pass through the delay unit. Accordingly, the signal having passed through the delay unit 1512 is directly transferred to the node C.

In operation, if the CAS latency is 5 (i.e., if cl5 is in a high level), the switching element 1513 is turned on. Accordingly, the signal input through the node A is directly transferred to the C node after passing through the delay units 1500 and 1501.

As described above, as the number of CAS latencies is increased (i.e., as the operating frequency of the memory device is increased), the delay amount obtained through the path from the node A to the node C is reduced.

The signal on the node C is transferred to the node B through the switching element 1516. The switching element 1516 is turned on/off by the test mode signal tmz_1. In the test mode, the test mode signal tmz_1 is kept in a low level. In the normal operation mode, the test mode signal tmz_1 is kept in a high level.

In the normal operation mode, the signal on the node C is transferred to the node B after passing through the switching element 1516, the inverter INV151, and the NAND gate NAND153.

In the test mode, however, the signal on the node C is outputted to the node D via the circuit illustrated in FIG. 16, and then transferred to the node B through the switching element 1516, the inverter INV151 and the NAND gate NAND153. The nodes C and D as illustrated in FIG. 15 are the same as the nodes C and D as illustrated in FIG. 16. That is, the circuit of FIG. 16 is a circuit provided between the nodes C and D of FIG. 15.

FIG. 16 illustrates an example of the circuit provided between the nodes C and D of FIG. 15. The circuit of FIG. 16 additionally adjusts the delay amount using the address signals in the test mode.

The circuit of FIG. 16 includes a plurality of delay units 1600, 1601, 1602, 1603, and 1604, switching elements 1611, 1612, 1613, 1614, and 1615 controlled by the address signals, and conversion units 1617 and 1618. In FIG. 16, the total delay time corresponds to a section from the node C to the node D. Here, the nodes C and D illustrated in FIG. 16 are the same as the nodes C and D illustrated in FIG. 15.

In FIG. 16, the address signals add_0 and add_1 having passed through the inverters are indicated as address bar signals add_0b and add_1b. As can be seen in FIG. 16, selection signals sel_3z, sel_2z, sel_1z, and sel_0z for controlling the turn-on/off of the switching elements are made by combination of the address signals.

As can be seen in FIG. 16, if the address signals add_0 and add_1 are low and low, respectively, the selection signal sel_3z is enabled to a low level. If the address signals add_0 and add_1 are low and high, respectively, the selection signal sel_2z is enabled to a low level. If the address signals add_0 and add_1 are high and low, respectively, the selection signal sel_1z is enabled to a low level. If the address signals add_0 and add_1 are high and high, respectively, the selection signal sel_0z is enabled to a low level.

Referring to FIG. 16, the turn-on/off operation of the switching elements 1611 and 1614 is controlled by the selection signals sel_2z and sel_3z. The turn-on/off operation of the switching element 1612 is controlled by the selection signal sel_1z. The turn-on/off operation of the switching element 1613 is controlled by the selection signal sel_0z. The turn-on/off operation of the switching element 1615 is controlled by the selection signal sel_3z.

In operation, if the selection signals sel_2z and sel_3z are low and low, respectively, an output signal of the NAND gate NAND161 that receives the selection signals Sel_2z and sel_3z becomes high. Accordingly, the switching elements 1611 and 1614 are turned on, and the signal input through the node C passes through the delay units 1600 and 1601, the conversion unit 1617, the delay units 1602 and 1603, and the conversion unit 1618. Here, if the selection signal sel_3z is in a low level, the signal having passed through the delay unit 1603 is transferred to the node D through the delay unit 1604, the NAND gate NAND163, and the inverter INV161. If the selection signal sel_3z is in a high level, the signal having passed through the delay unit 1603 is transferred to the node D through the NAND gate NAND163 and the inverter INV161. Accordingly, if the selection signals sel_2z and sel_3z are low and low, respectively, the signal having passed through the delay unit 1603 is transferred to the node D through the delay unit 1604, the NAND gate NAND163 and the inverter INV161.

In operation, if the selection sel_1z is low, the switching element 1612 is turned on. Accordingly, the signal input through the node C passes through the delay units 1600 and 1601, the conversion unit 1617, and the delay unit 1602. In this case, because the selection signal sel_3z is in a high level, the signal having passed through the delay unit 1602 is directly transferred to the node D through the NAND gate NAND163 and the inverter INV161.

In operation, if the selection sel_0z is low, the switching element 1613 is turned on. Accordingly, the signal input through the node C passes through the delay unit 1600. In this case, because the selection signal sel_3z is in a high level, the signal having passed through the delay unit 1600 is transferred to the node D through the NAND gate NAND163 and the inverter INV161.

As can be seen in FIG. 16, in the test mode, the delay time corresponding to the section from the node C to the node D can be adjusted using the selection signals generated by the combination of the external address signals add_0 and add_1.

Figure 17:
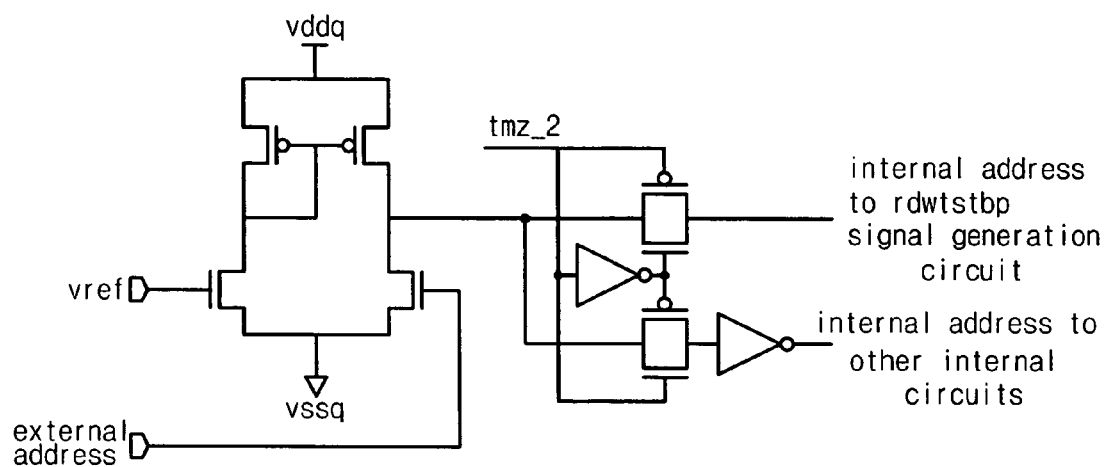
FIG. 17 is a circuit diagram of an address buffer according to an embodiment of the present invention.

FIG. 17 is a circuit diagram of an address buffer according to an embodiment of the present invention.

In FIG. 17, the term "vref" denotes a reference voltage, "vddq" a power supply, and "vssq" a ground. As illustrated in FIG. 7, in the test mode (i.e., if the test mode signal tmz_2 is enabled to a low level), the addresses add_0 and add_1 applied from the outside are applied to the circuit of FIG. 14. That is, the addresses add_0 and add_1 illustrated in FIG. 14 are the address signals output from the address buffer illustrated in FIG. 17.

In the normal operation mode (i.e., if the test mode signal tmz_2 is in a high level), the addresses applied from the outside are normally applied to the internal circuits that require the address signals.

Figure 18:
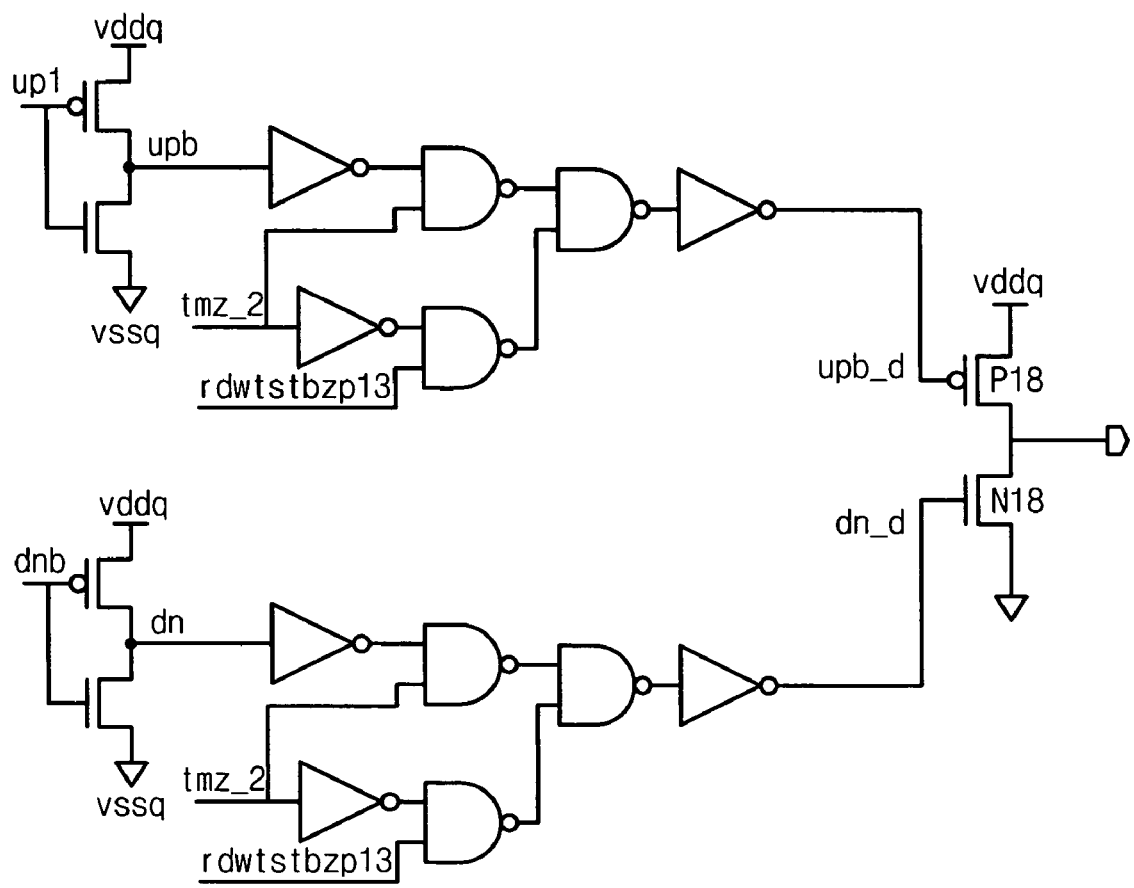
FIG. 18 is a circuit diagram of a data output buffer according to an embodiment of the present invention.

FIG. 18 is a circuit diagram of a data output buffer according to an embodiment of the present invention.

In FIG. 18, the terms "up" and "dnb" denote data signals. The term "upb" is an inverted signal of the "up" signal, and the term "dn" is an inverted signal of the "dnb" signal. The term "upb_d" is a signal applied to a gate of a pull-up transistor P18, and "dn_d" is a signal applied to a gate of a pull-down transistor N18. The term "DQ" denotes a data pad or a data pin.

As shown in FIG. 18, in the test mode (i.e., when the test mode signal tmz_2 is in a low level), the read/write strobe pulse signal rdwtstbzp13 that is the output signal of the circuit of FIG. 14 is applied to the gates of the pull-up and pull-down transistors P18 and N18. Accordingly, in the test mode, the read/write strobe pulse signal can be monitored in a packaged state of the memory device through the data pin DQ.

In the normal operation mode (i.e., the test mode signal tmz_2 is in a high level), the internal data upb and dn of the memory device are applied to the gates of the pull-up and pull-down transistors P18 and N18. Accordingly, the data output buffer outputs the internal data of the memory device to the outside through the data pin DQ.

Figure 19:
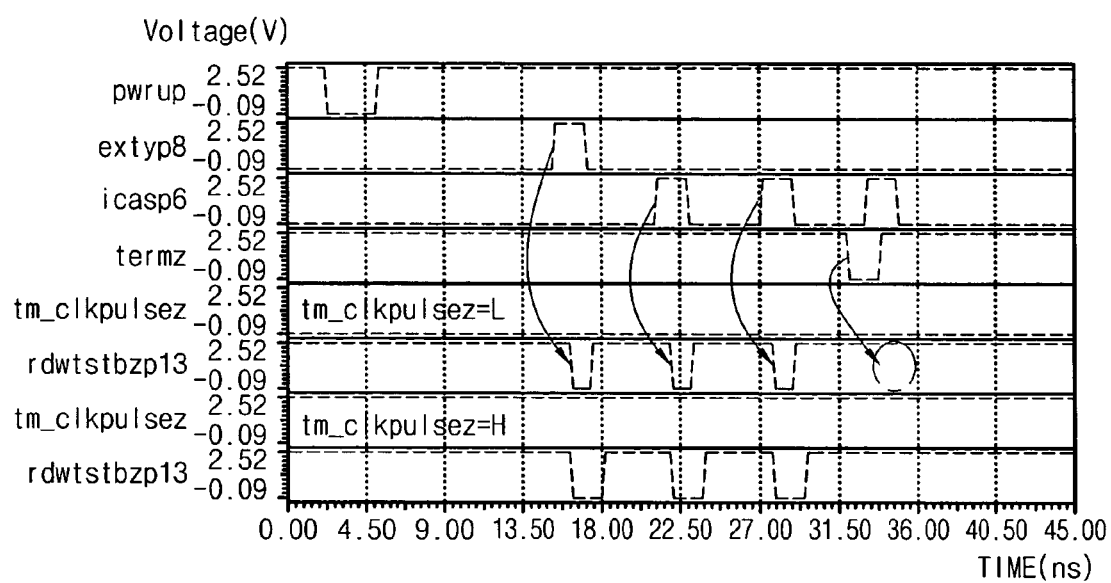

FIG. 19 is a waveform diagram of the output signals of the conventional circuit illustrated in FIG. 2a.

As can be seen in FIG. 19, the conventional circuit can just adjust the pulse width of the output signal rdwtstbzjp13 according to the logic level of the tm_clkpulsez signal.

Figure 20:
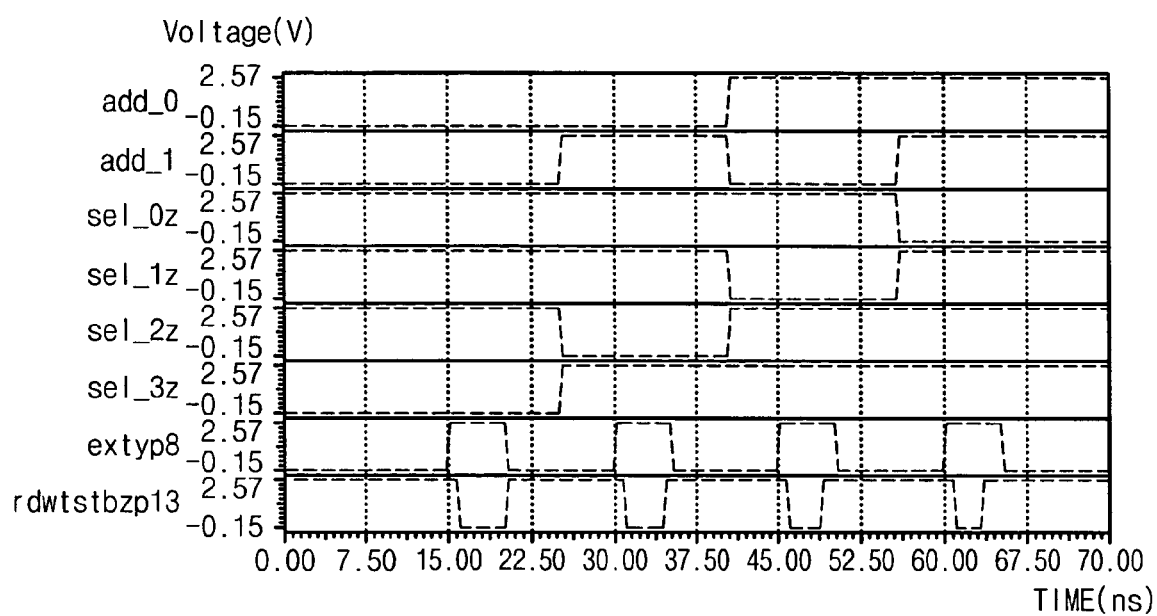
FIG. 20 is a waveform diagram of signals used in the circuit illustrated in FIG. 14 according to the present invention.

FIG. 20 is a waveform diagram of signals used in the circuit of FIG. 14 according to the present invention. In FIG. 20, the pulse width change of the output signal rdwtstbzp13 according to the variation of the address signals add_0 and add_1 in a state that the CAS latency is fixed in the text mode is illustrated.

As illustrated in FIG. 20, as the address signals add_0 and add_1 are changed (0,0), (0,1), (1,0), and then (1,1) in order, the pulse width of the output signal rewtstbzp13 is reduced. This can clearly be recognized with reference to FIGS. 15 and 16.

Figure 21:
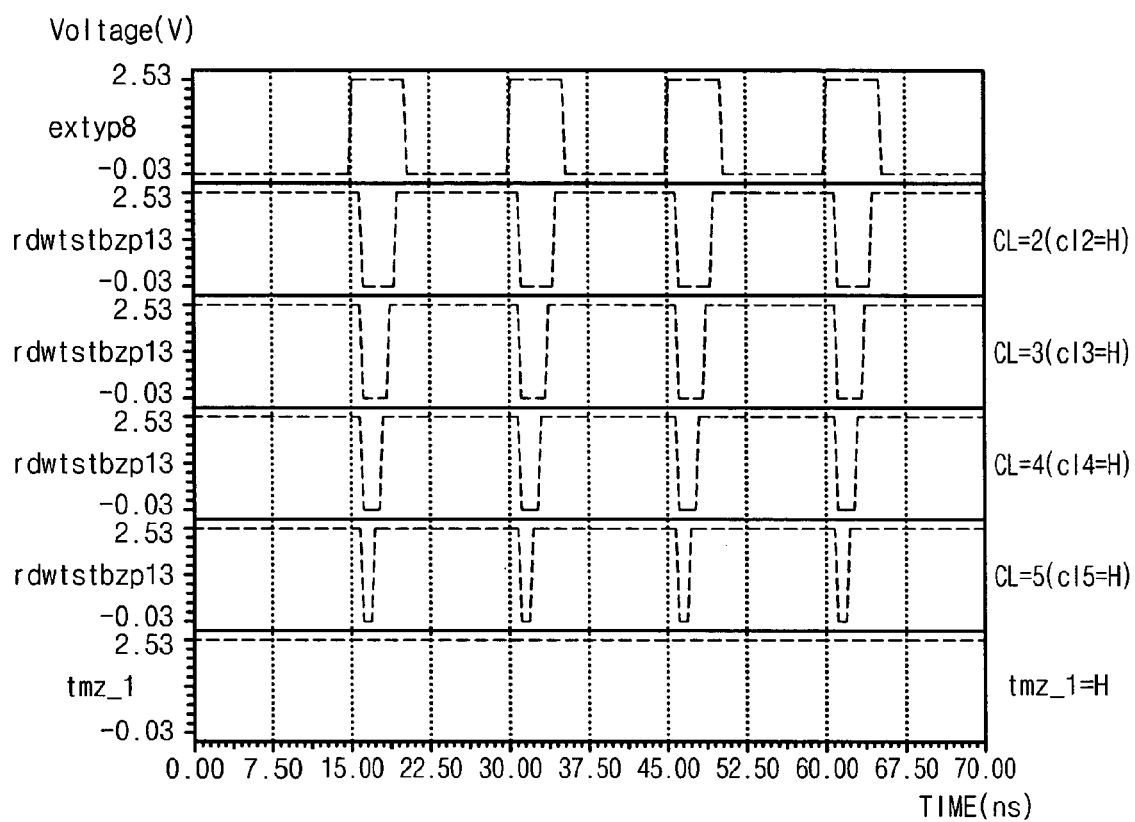
FIG. 21 is a waveform diagram of other signals used in the circuit illustrated in FIG. 14 according to the present invention.

FIG. 21 is a waveform diagram of other signals used in the circuit illustrated in FIG. 14 according to the present invention. In FIG. 21, the pulse width change of the output signal according to the change of the CAS latency in the normal operation mode (i.e., when the test mode signal tmz_1 is in a high level) is illustrated.

As illustrated in FIG. 21, if the CAS latency is increased in correspondence to the increase of the operating frequency, the pulse width of the output signal rdwtstbzp13 is reduced.

Figure 22:
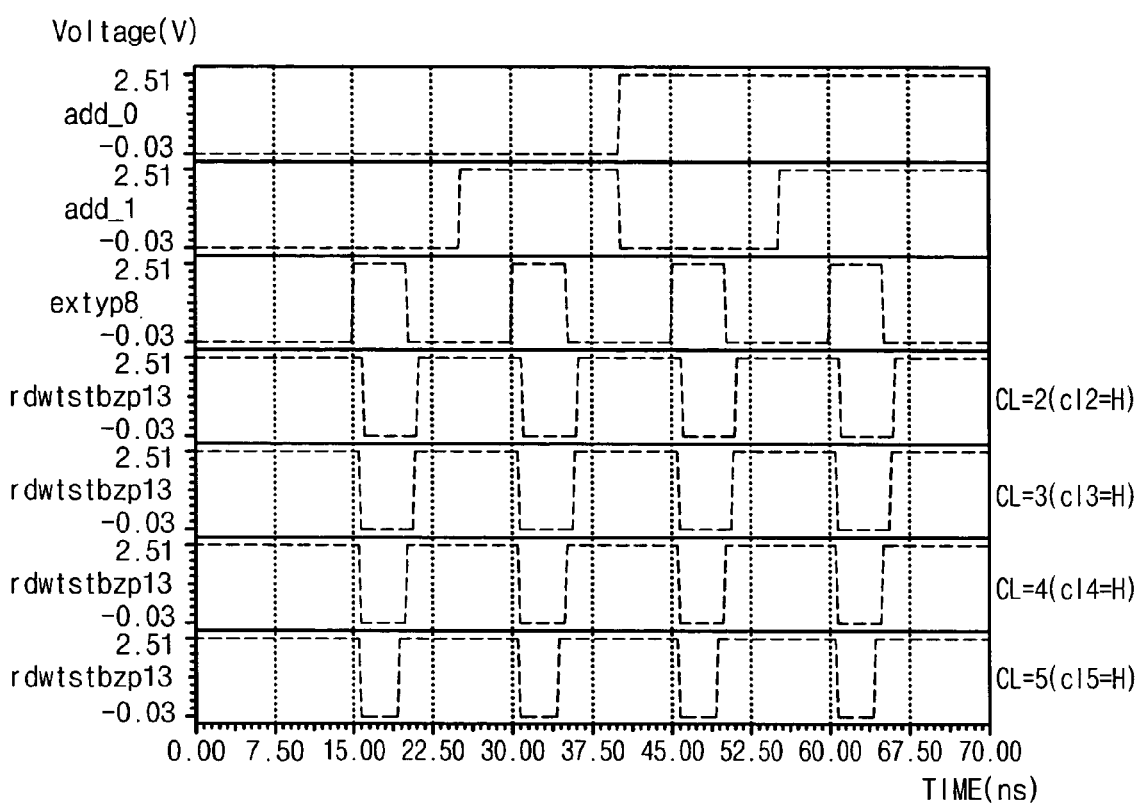
FIG. 22 is a waveform diagram of still other signals used in the circuit illustrated in FIG. 14 according to the present invention.

FIG. 22 is a waveform diagram of still other signals used in the circuit illustrated in FIG. 14 according to the present invention. In FIG. 22, the change of the output signal rdwtstbzp13 according to the change of the address signals add_0 and add_1 and the CAS latency in the test mode is illustrated.

As illustrated in FIG. 22, if the CAS latency is constant, the pulse width of the output signal rewtstbzp13 is reduced as the address signals add_0 and add_1 are changed (0,0), (0,1), (1,0), and then (1,1) in order. Additionally, in the case that the address signals are fixed and the CAS latency is increased, the pulse width of the output signal rdwtstbzp13 is reduced. Accordingly, if the operating frequency of the memory device is increased, the enabled section of the signal Yi that is controlled by the output signal rdwtstbzjp13 can also be reduced.

Figure 23:
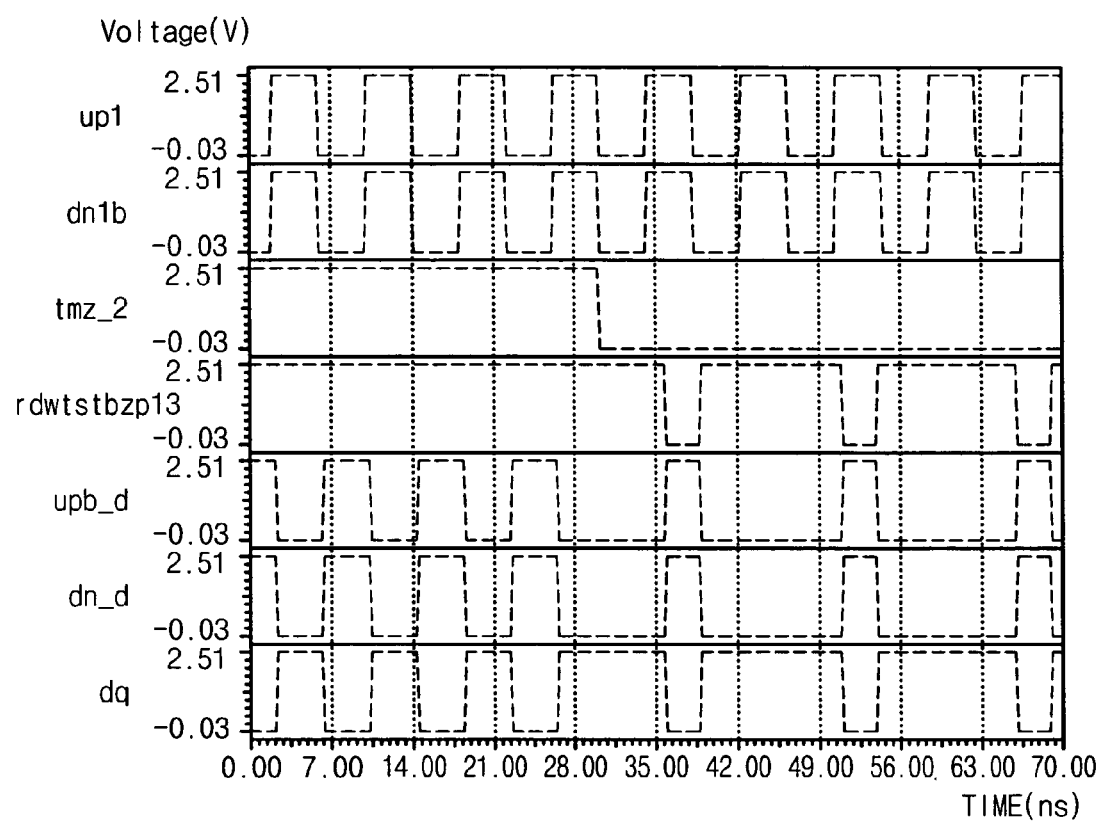
FIG. 23 is a waveform diagram of signals used in a data output buffer of FIG. 18.

FIG. 23 is a waveform diagram of signals used in the data output buffer of FIG. 18. As illustrated in FIG. 23, the read/write strobe pulse signal is output through the data pin in the test mode, and the internal data is output through the data pin in the normal operation mode.

As described above, according to the present invention, the pulse width of the read/write strobe pulse signal rdwtstbzp13 can be adjusted even if the CAS latency is changed due to the change of the operating frequency of the memory device or the driving voltage of the memory device is changed.

If the circuit and the method according to the present invention are used, the pulse width of the signal Yi can automatically be adjusted, and thus an FIB work for the delay tuning whenever the operating frequency is changed is not required. This saves the cost and time in comparison to the conventional circuit.

Additionally, using the data output buffer according to the present invention in the test mode, the read/write strobe pulse signal generated inside the memory device can be monitored from the outside.

The circuit and method according to the present invention can reduce the cost and time required for the FIB work for the delay time adjustment according to the change of the operating voltage due to the change of the operating frequency and the influence of the external environment.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus monitoring an internal control signal of memory device, comprising:
   an input signal receiving unit for receiving a first signal generated by a burst operation command and N−1 (where, N is a burst length) second signals subsequently generated after the first signal is generated, and outputting a third signal which is synchronized with the first and second signals;
   a pulse width adjustment unit for receiving the third signal output from the input signal receiving unit, selecting a delay path of the third signal in accordance with a control signal which is corresponding to a variation of an operating frequency of the memory device, and outputting the third signal changed a pulse width by passing through the delay path;
   a signal transferring unit for buffering a signal output from the pulse width adjustment unit;
   an output unit for receiving a signal output from the signal transferring unit and outputting a fourth signal for controlling an operation of a data bus; and
   an output buffer for receiving and transferring the fourth signal externally of the memory device.

2. The apparatus as claimed in claim 1, wherein the control signal is a clock signal of the memory device in order to judge an operating frequency range of the memory device.

3. The apparatus as claimed in claim 2, wherein the pulse width of the fourth signal decreases as a period of the clock signal decreases.

4. The apparatus as claimed in claim 2, wherein the pulse width adjustment unit comprises:
   a divider for dividing a frequency of the clock signal;
   first and second delay units for receiving a divided signal output from the divider; and
   a first means for changing the pulse width of the third signal by comparing time delays from the first and second delay units, and selecting the delay path of the third signal.

5. The apparatus as claimed in claim 4, wherein the pulse width adjustment unit further comprises a second means for receiving the address signals, and additionally changing the pulse width of the third signal and the delay path of the third signal.

6. An apparatus monitoring an internal control signal of memory device, comprising:
   an address input unit for controlling a transfer path of address signals in accordance with a first test mode signal;
   a pulse width adjustment unit for receiving an input signal synchronized with a burst operation command and transferred, and providing with an output signal for controlling an operation of a data bus by changing a pulse width of the input signal in accordance with a first delay path selected by a control signal having information of an operating frequency of the memory device and a second delay path selected by a combination of a second test mode signal and the address signals; and
   a data output buffer for outputting the output of the pulse width adjustment unit to a pad in accordance with the first test mode signal.

7. The apparatus as claimed in claim 6, wherein the input buffer comprises a switch controlled by the test mode signal and transfers the address signals to either of the pulse width adjustment unit or another internal circuit where the address signals are needed.

8. The apparatus as claimed in claim 6, wherein the pulse width adjustment unit comprises:
   a first delay adjustment unit for forming the first delay path by the control signal, and changing the pulse width of the input signal which is passing through the first delay path;
   a second delay adjustment unit for forming the second delay path by a combination of the second test mode signal and the address signals, and changing the pulse width of the output of the first delay adjustment which is passing through the second delay path; and
   an output unit for buffering the output of the second delay adjustment unit and providing it to the data output buffer.

9. The apparatus as claimed in claim 8, wherein the pulse width adjustment unit further comprises a circuit unit for a test mode which is selectively intercepting the output signal in a test mode.

10. The apparatus as claimed in claim 8, wherein the control signal is a clock signal having information of an operating frequency of the memory device.

11. The apparatus as claimed in claim 10, wherein the pulse width adjustment unit comprises:
    a divider for dividing a frequency of the clock signal;
    first and second delay units for receiving a divided signal of the divider and having different amount of delaying from each other; and
    a judgment unit for outputting a judgment signal of an operating frequency in order to judge an operating frequency range of the memory device for forming the first delay path by comparing the frequency of the clock signal and time delays from the first and second delay units.

12. The apparatus as claimed in claim 6, wherein the control signal is a CAS (Column Address Strobe) latency signal having information of an operating frequency of the memory device.

13. The apparatus as claimed in claim 6, wherein the input signal is a signal synchronized with the respective rising edges of the first signal generated by synchronizing with a clock signal which the burst operation command is applied, and N−1 (where, N is a burst length) second signals synchronized with a clock signal after the generating time of the first signal and subsequently generated.

14. The apparatus as claimed in claim 6, wherein the data output buffer comprises first and second driver units in different sizes for transferring to the pad by driving either of the output signal of the pulse width adjustment unit or a memory cell data in accordance with the first test mode signal.

* * * * *